(12) United States Patent
Hirao et al.

(10) Patent No.: US 10,490,533 B2
(45) Date of Patent: Nov. 26, 2019

(54) LIGHT EMITTING APPARATUS, ILLUMINATION APPARATUS AND DISPLAY APPARATUS

(71) Applicant: Sony Corporation, Tokyo (JP)

(72) Inventors: Naoki Hirao, Kanagawa (JP); Katsuhiro Tomoda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/362,260

(22) Filed: Mar. 22, 2019

(65) Prior Publication Data

US 2019/0221551 A1 Jul. 18, 2019

Related U.S. Application Data

(63) Continuation of application No. 15/588,049, filed on May 5, 2017, now Pat. No. 10,249,600, which is a (Continued)

(30) Foreign Application Priority Data

Feb. 24, 2011 (JP) .................................. 2011-038639

(51) Int. Cl.
*H01L 33/18* (2010.01)
*H01L 25/075* (2006.01)
(Continued)

(52) U.S. Cl.
CPC .......... *H01L 25/0753* (2013.01); *G09G 5/10* (2013.01); *H01L 24/24* (2013.01); *H01L 24/34* (2013.01);
(Continued)

(58) Field of Classification Search
USPC ..... 257/13, 79–103, 918, 40, 642–643, 759; 438/22–47, 69, 493, 503, 507, 956
See application file for complete search history.

(56) References Cited

U.S. PATENT DOCUMENTS 6,936,855 B1   8/2005  Harrah
2005/0233504 A1  10/2005  Doi et al.
(Continued)

FOREIGN PATENT DOCUMENTS

| JP | 2004-273596 | 9/2004 |
|---|---|---|
| JP | 2010-283267 | 12/2010 |
| JP | 2010-541224 | 12/2010 |

OTHER PUBLICATIONS

Japanese Office Examination Report issued in connection with related Japanese Patent Application No. JP 2011-038639 dated May 20, 2014.

*Primary Examiner* — Moin M Rahman
(74) *Attorney, Agent, or Firm* — Dentons US LLP

(57) ABSTRACT

A light emitting apparatus including: one or a plurality of light emitting devices each having a plurality of electrodes and each emitting light from the upper surface of the light emitting device; a plurality of terminal electrodes provided on the lower side of the light emitting devices in a positional relation with the light emitting devices and electrically connected to the electrodes of the light emitting devices; a first metal line brought into contact with the upper surfaces of the light emitting devices and one of the terminal electrodes, provided at a location separated away from side surfaces of the light emitting devices and created in a film creation process; and an insulator in which the light emitting devices and the first metal line are embedded.

30 Claims, 18 Drawing Sheets

Related U.S. Application Data continuation of application No. 14/714,879, filed on May 18, 2015, now Pat. No. 9,679,536, which is a continuation of application No. 13/361,264, filed on Jan. 30, 2012, now Pat. No. 9,065,029.

(51) Int. Cl.

| | | |
|---|---|---|
| *H01L 23/00* | (2006.01) | |
| *H01L 33/60* | (2010.01) | |
| *H01L 33/62* | (2010.01) | |
| *G09G 5/10* | (2006.01) | |
| *H01L 33/54* | (2010.01) | |
| *H01L 33/38* | (2010.01) | |

(52) U.S. Cl.
CPC .............. *H01L 24/36* (2013.01); *H01L 24/40* (2013.01); *H01L 24/82* (2013.01); *H01L 33/385* (2013.01); *H01L 33/54* (2013.01); *H01L 33/60* (2013.01); *H01L 33/62* (2013.01); *H01L 24/37* (2013.01); *H01L 2224/371* (2013.01); *H01L 2224/3754* (2013.01); *H01L 2224/40245* (2013.01); *H01L 2924/00014* (2013.01); *H01L 2924/014* (2013.01); *H01L 2924/01029* (2013.01); *H01L 2924/01033* (2013.01); *H01L 2924/01047* (2013.01); *H01L 2924/01079* (2013.01); *H01L 2924/12041* (2013.01); *H01L 2924/12042* (2013.01); *H01L 2924/15788* (2013.01); *H01L 2924/181* (2013.01); *H01L 2933/005* (2013.01); *H01L 2933/0016* (2013.01); *H01L 2933/0033* (2013.01); *H01L 2933/0066* (2013.01)

(56) References Cited

U.S. PATENT DOCUMENTS

| | | |
|---|---|---|
| 2006/0181894 A1 | 8/2006 | Chinniah et al. |
| 2007/0126356 A1 | 6/2007 | Tanda et al. |
| 2007/0200133 A1 | 8/2007 | Hashimoto et al. |
| 2008/0081400 A1 | 4/2008 | Doi et al. |
| 2009/0224268 A1* | 9/2009 | Tsuchiya ............... H01L 33/486 257/88 |
| 2010/0078824 A1 | 4/2010 | Okamori |
| 2010/0159165 A1 | 6/2010 | Ueda et al. |
| 2011/0133217 A1 | 6/2011 | Hakamata et al. |
| 2011/0210370 A1 | 9/2011 | Kamamori et al. |
| 2012/0098001 A1 | 4/2012 | Cheng |

\* cited by examiner $Y < X / \tan \theta m$ $Y = H2 - H1 = D$ $Y = (W2 - W1)/2$

LIGHT EMITTING APPARATUS, ILLUMINATION APPARATUS AND DISPLAY APPARATUS

RELATED APPLICATION DATA

This application is a continuation of U.S. patent application Ser. No. 15/588,049 filed May 5, 2017, which is a continuation of U.S. patent application Ser. No. 14/714,879 filed May 18, 2015, now U.S. Pat. No. 9,679,536 issued Jun. 13, 2017, which is a continuation of U.S. patent application Ser. No. 13/361,264 filed Jan. 30, 2012, now U.S. Pat. No. 9,065,029 issued Jun. 23, 2015, the entireties of which are incorporated herein by reference to the extent permitted by law. The present application contains subject matter related to and claims the benefit of priority to Japanese Patent Application No. JP 2011-038639 filed on Feb. 24, 2011 in the Japan Patent Office, the entirety of which is incorporated by reference herein to the extent permitted by law.

BACKGROUND

The present disclosure relates to a light emitting apparatus employing one light emitting device or a plurality of light emitting devices and relates to an illumination apparatus as well as a display apparatus which both employ the light emitting apparatus.

In recent years, an LED (Light Emitting Diode) display unit serving as a light and thin display unit draws much attention. The LED display unit employs an LED in each display pixel thereof. The LED display unit is characterized in that the LED display unit does not exhibit visual-field angle dependence. The visual-field angle dependence is a characteristic showing contrast and hue changes according to the visual field. In addition, the LED display unit is also characterized in that the LED display unit reacts to a color change quickly in case there is a color change. However, it is necessary to mount several millions of LED chips of display pixels at a high transfer-time yield on a wiring substrate used for wiring the LED chips to each other. Thus, it is necessary to provide a method for mounting the LED chips on the wiring substrate at a high transfer-time yield by carrying out simple processes.

Documents such as Japanese Patent Laid-open No. 2004-273596 disclose a method for transferring LED chips (each serving as a light emitting device cited above) to a wiring substrate in a batch operation. To put it concretely, the LED chips are held in a resin layer on a transfer substrate. Then, the side of the resin layer holding the LED chips on the transfer substrate as they are is pasted on the wiring substrate. Subsequently, a peeling process is carried out on the boundary surface between the transfer and wiring substrates.

SUMMARY

The LED chip described above has a very small typical size of about 20 microns. Thus, if an LED chip must be replaced with another for some reasons after the chip has been mounted on a wiring substrate, the handleability of the chip at the replacement work time is not so good. A conceivable typical application of the LED chip is a light emitting apparatus of the type of a package having a large size. In the light emitting apparatus, one or a plurality of LED chips are sealed by making use of resin. The light emitting apparatus is mounted on a wiring substrate. In such an application, the size of the light emitting apparatus is larger than the size of the LED chip. Thus, the handleability at the replacement work time can be improved.

If the size of the light emitting apparatus is too large in comparison with the size of the light emitting device, however, the scale of integration of the light emitting devices on the wiring substrate is inevitably small. In this case, the scale of integration of the light emitting devices is the number of the light emitting devices per unit area. In addition, if the light emitting apparatus is too thick, the amount of light incident to the upper surface of the light emitting apparatus decreases so that the amount of light that can be fetched from the upper surface of the light emitting apparatus also undesirably decreases as well. If an attempt is to be made to make the light emitting apparatus thick and to increase the amount of light that can be fetched from the upper surface of the light emitting apparatus, it is necessary to raise the size of the light emitting apparatus. Thus, the scale of integration of the light emitting devices becomes unavoidably small.

As is obvious from the above description, reducing the thickness of the light emitting apparatus as much as possible is desirable as seen from the two following points of view. In the first place, a reduced thickness of the light emitting apparatus increases the amount of light that can be fetched from the upper surface of the light emitting apparatus. In the second place, a reduced thickness of the light emitting apparatus increases the integration of the light emitting devices on the wiring substrate. If the integration of the light emitting devices on the wiring substrate increases, however, it becomes difficult to make use of a bonding wire as a wire for electrically connecting a surface electrode on the upper surface of the light emitting device and a terminal electrode of the light emitting apparatus to each other. Even if a bonding wire can be used as a wire for electrically connecting a surface electrode on the upper surface of the light emitting device and a terminal electrode of the light emitting apparatus to each other, it is very difficult to have the bonding wire embedded into resin including light emitting devices embedded therein because the thickness of the light emitting apparatus is small. If the bonding wire protrudes out from the upper surface of the resin including light emitting devices embedded therein, the bonding wire can become a cause of a low transfer-time yield obtained at the transfer time of the light emitting apparatus.

It is thus a first aim of the present disclosure addressing the problems described above to provide a package-type light emitting apparatus allowing the thickness to be reduced throughout the entire apparatus without lowering the yield of what is obtained from a wafer and the yield obtained at a transfer time. In addition, it is a second aim of the present disclosure to provide an illumination apparatus as well as a display apparatus which both employ the light emitting apparatus.

A light emitting apparatus provided by the embodiments of the present disclosure includes:

one or a plurality of light emitting devices each having a plurality of electrodes and each emitting light from the upper surface of the light emitting device;

a plurality of terminal electrodes provided on the lower side of the light emitting devices in a positional relation with the light emitting devices and electrically connected to the electrodes of the light emitting devices;

a first metal line brought into contact with the upper surfaces of the light emitting devices and one of the terminal electrodes, provided at a location separated away from side surfaces of the light emitting devices and created in a film creation process; and an insulator in which the light emitting devices and the first metal line are embedded.

An illumination apparatus provided by the embodiments of the present disclosure includes a plurality of light emitting apparatus mounted on a substrate. Each of the light emitting apparatus has the same configuration elements as the light emitting apparatus described above as the light emitting apparatus provided by the embodiments of the present disclosure.

A display apparatus provided by the embodiments of the present disclosure includes a display panel having a plurality of pixels and a driving circuit for driving the pixels on the basis of a video signal. Each of the pixels on the display panel of the display apparatus provided by the embodiments of the present disclosure is one of a plurality of light emitting apparatus mounted on a substrate. Each of the light emitting apparatus has the same configuration elements as the light emitting apparatus described above as the light emitting apparatus provided by the embodiments of the present disclosure.

In the light emitting apparatus, the illumination apparatus and the display apparatus which are provided by the embodiments of the present disclosure, the first metal line brought into contact with the upper surfaces of the light emitting devices and one of the terminal electrodes is not a bonding wire but a wire created in a film creation process. Thus, the first metal line can be embedded in the insulator in which the light emitting devices are also embedded.

The light emitting apparatus provided by the embodiments of the present disclosure may further have a second metal line electrically connected to the terminal electrode not connected to the first metal line, extended toward the upper surfaces of the light emitting devices and created in a film creation process. In such a configuration, the second metal line can be embedded in the insulator.

By the way, each of the first and second metal lines in the present disclosure can be created by carrying out processes (A1) to (A3) described as follows:
(A1): A process of creating a sacrifice layer for covering side surfaces of the light emitting devices and covering a portion of a surface of each of the terminal electrodes.
(A2): A process of stacking a plating metal on a predetermined area of the upper surface of a seed metal after creating the seed metal on the entire surface including the sacrifice layer.
(A3): A process of removing the sacrifice layer and at least a member included in the seed metal and not brought into contact with the plating metal.

If each of the first and second metal lines in the present disclosure is a line created by carrying out the processes described above, the insulator can be created by creating a transparent resin layer and hardening the layer so as to embed the light emitting device as well as the first and second metal lines.

The light emitting apparatus provided by the embodiments of the present disclosure can be manufactured by carrying out processes (B1) to (B7) described as follows:
(B1): A process of fixing one or a plurality of light emitting devices each having a plurality of electrodes and each emitting light from the upper surface of the light emitting device on one or a plurality of terminal electrodes on a wiring substrate having the terminal electrodes already created on the surface of the wiring substrate.
(B2): A process of creating a sacrifice layer for covering side surfaces of the light emitting devices and covering a portion of a surface of each of the terminal electrodes.
(B3): A process of stacking a plating metal on a predetermined area of the upper surface of a seed metal after creating the seed metal on the entire surface including the sacrifice layer.
(B4): A process of creating a first metal line for electrically connecting one terminal electrode of the light emitting apparatus and one electrode of the light emitting device and creating a second metal line electrically connected to another terminal electrode not connected to the first metal line by removing the sacrifice layer and at least a member included in the seed metal and not brought into contact with the plating metal.
(B5): A process of creating an insulator by creating a transparent resin layer and hardening the layer so as to embed the light emitting device as well as the first and second metal lines.
(B6): A process of separating the insulator for each light emitting device or for each plurality of light emitting devices.
(B7): A process of peeling off the substrate.

In the manufacturing methods described above, the light emitting device is typically used as an LED chip. The LED chip is a chip cut out from a wafer making use of crystal growth. That is to say, the LED chip is not a chip of a package type coated with created resin or the like. The size of the LED chip is typically in a range of a value not smaller than 5 microns to a value not greater than 100 microns. The LED chip has a thin chip shape having an aspect ratio in a range of a value not smaller than 0.1 to a value smaller than 1. The aspect ratio of the LED chip is defined as the ratio of the height of the chip to the weight of the chip.

In addition, in the manufacturing methods described above, the sacrifice layer is typically a photo-resist layer. The sacrifice layer typically has an upper-surface shape getting rounder due to a reflow implementation and/or use of a grey scale mask. On top of that, in the manufacturing methods described above, the transparent resin can be resin created by carrying out typically a single-layer plating process or a multi-layer plating process. In addition, in the manufacturing methods described above, the insulator separation process can be carried out by adoption of typically a photolithography technique, a milling technique or the like. On top of that, in the manufacturing methods described above, it is desirable to make use of a light emitting device and an insulator each having a height and a width which both satisfy typically relations determined in advance.

In accordance with the light emitting apparatus, the illumination apparatus and the display apparatus which are provided by the embodiments of the present disclosure, the first metal line can be embedded into an insulator in which light emitting devices have been embedded. Thus, the thickness can be reduced throughout the entire light emitting apparatus without lowering the yield of what is obtained from a wafer and the yield obtained at a transfer time.

In addition, in an embodiment of the present disclosure, the first metal line is created by carrying out a film creation process. Thus, by selecting a proper film creation method, it is possible to do things such as creation of the first metal line in a conformal way in spite of the very fine structure of the first metal line and creation of the first metal line including a dented portion slightly thicker than required. As a result, the structure of the first metal line can be made stable electrically and mechanically.

DETAILED DESCRIPTION OF THE PREFERRED EMBODIMENTS

Embodiments of the present disclosure are explained below in detail by referring to the diagrams. It is to be noted that the embodiments are explained by describing topics in the following order.

1: First Embodiment (Implementing a Light Emitting Apparatus)

In this typical light emitting apparatus, three light emitting devices are coated with a resin having a small thickness.

2: Typical First-Embodiment Modified Versions (Implementing Other Light Emitting Apparatus)

In this other light emitting apparatus, a line is provided with a protrusion having a light reflecting function. In addition, the upper surface of an insulator is a rough face. The number of light emitting devices is different from that of the first embodiment.

3: Second Embodiment (Implementing a Display Apparatus)

This display apparatus is a typical display apparatus employing the light emitting apparatus according to the first embodiment and its modified version.

4: Typical Second-Embodiment Modified Versions (Implementing Other Display Apparatus)

The number of light emitting devices in these other display apparatus is different from that of the display apparatus according to the second embodiment. These other display apparatus have a common data line. The light

5: Third Embodiment (Implementing an Illumination Apparatus)

This illumination apparatus is a typical illumination apparatus employing the light emitting apparatus according to the first embodiment and its modified version as light sources.

1: First Embodiment

Configuration

Figure 1A:
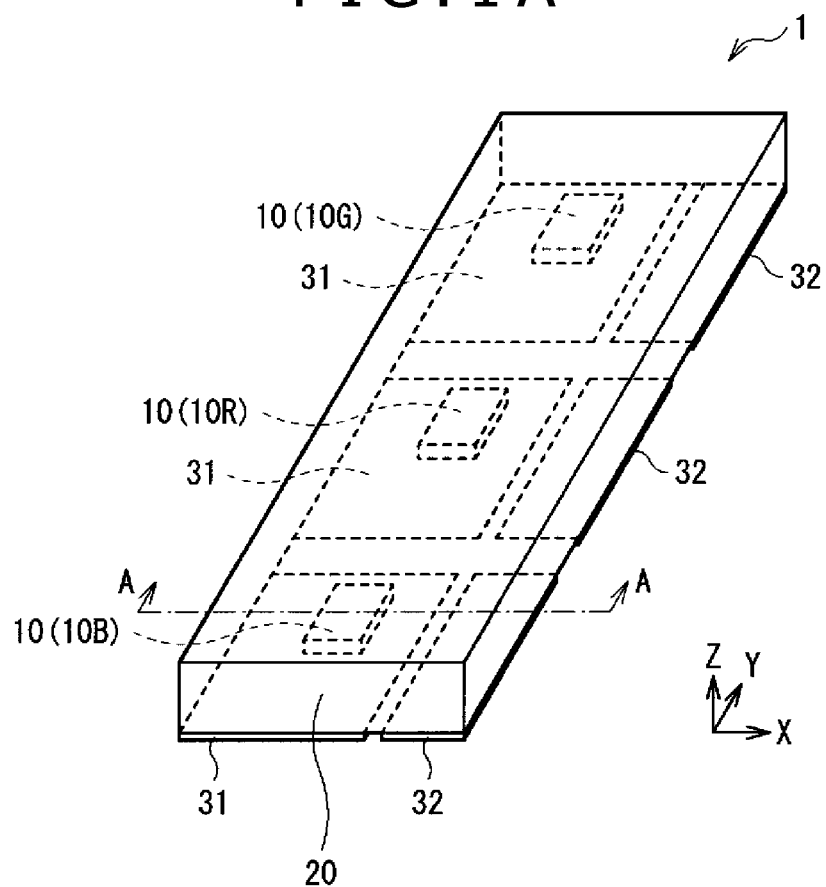
FIGS. 1A and 1B are perspective-view and cross-sectional diagrams each showing a typical configuration of a light emitting apparatus according to a first embodiment of the present disclosure.
Figure 1B:
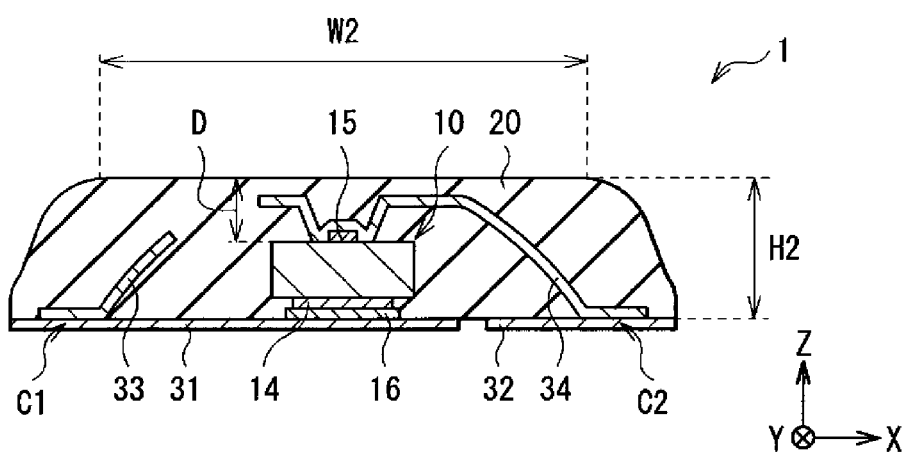

First of all, a light emitting apparatus 1 according to a first embodiment of the present disclosure is explained. FIG. 1A is a perspective-view diagram showing a rough typical configuration of the light emitting apparatus 1 whereas FIG. 1B is a diagram showing a cross-sectional configuration of the light emitting apparatus 1 at a location indicated by an arrow A-A shown in FIG. 1A. The light emitting apparatus 1 can be applied well as a display pixel of a display apparatus known as the so-called LED display unit. The light emitting apparatus 1 is designed into a small package in which a plurality of light emitting devices are coated with a resin having a small thickness.

Light Emitting Devices 10

Figure 2:
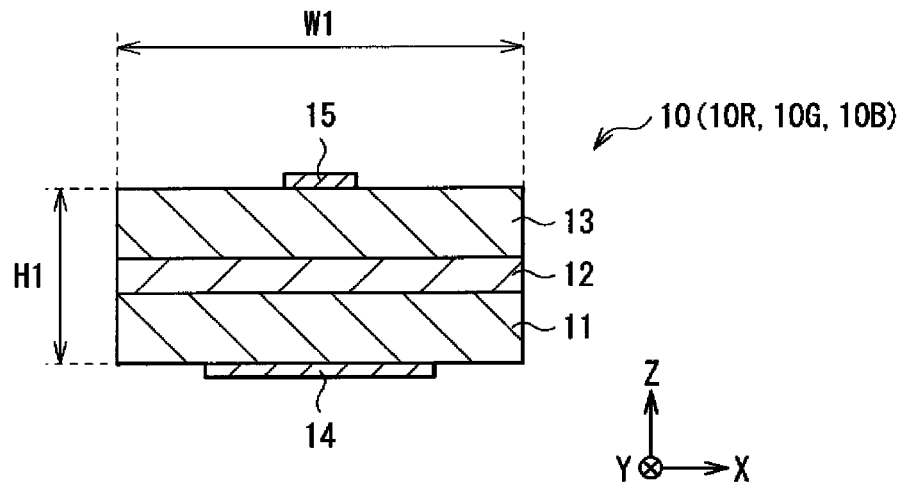
FIG. 2 is a cross-sectional diagram showing a typical configuration of a light emitting device employed in the light emitting apparatus shown in FIGS. 1A and 1B.

As shown in FIG. 1A, the light emitting apparatus 1 employs three light emitting devices 10. Each of the light emitting devices 10 is a solid-state light emitting device emitting light having a wavelength band determined in advance from the upper surface of the light emitting device 10. To put it concretely, each of the light emitting devices 10 is an LED chip. The LED chip is a chip in a state of being cut out from a wafer used for crystal growth. The LED chip is not a chip of a package type coated with a created resin or the like. The LED chip has a typical size in a range of a value not smaller than 5 microns to a value not greater than 100 microns. This size is also referred to as a horizontal width W1 shown in FIG. 2. The LED chip is known as the so-called micro LED. Typically, the planar shape of the LED chip is approximately rectangular. The LED chip has the shape of a thin chip. The aspect ratio of the LED chip has a typical value in a range of a value not smaller than 0.1 to a value smaller than 10. The aspect ratio of the LED chip is defined as the ratio of the vertical height H1 of the chip to the horizontal weight W1 of the chip. The vertical height H1 of the LED chip and the horizontal weight W1 of the chip are shown in FIG. 2. The horizontal height H1 of the LED chip serving as the light emitting device 10 has a typical value in a range of a value not smaller than 3 microns to a value not greater than 50 microns.

The light emitting devices 10 are laid out in the light emitting apparatus 1. As shown in FIG. 1A, typically, the light emitting devices 10 are laid out to form an array, being separated from each other by a gap determined in advance. The gap between two light emitting devices 10 adjacent to each other is typically equal to or greater than the size of the light emitting device 10. It is to be noted that, depending on the configuration of the light emitting apparatus 1, the gap may be made smaller than the size of the light emitting device 10. The distance between the light emitting devices 10 and a side surface of the light emitting apparatus 1 has a typical value equal to or greater than ½ of the size of the light emitting device 10.

The light emitting devices 10 emit light rays of wavelength bands different from each other. As shown in FIG. 1A for example, the three light emitting devices 10 include a light emitting device 10G emitting light of a green-color band, a light emitting device 10R emitting light of a red-color band and a light emitting device 10B emitting light of a blue-color band. The light emitting device 10G is typically placed at a location close to a specific side of the light emitting apparatus 1. The light emitting device 10B is typically placed at a location close to another side of the light emitting apparatus 1 on the opposite side of the specific side. The light emitting device 10R is typically placed at a location between the light emitting device 10G and the light emitting device 10B. It is to be noted that the aforementioned locations of the light emitting device 10R, the light emitting device 10G and the light emitting device 10B are no more than typical locations. In the following description, however, the light emitting device 10R, the light emitting device 10G and the light emitting device 10B may be assumed to be fixed at their respective locations explained above in order to describe relations to the positions of other configuration elements.

As shown in FIG. 2 for example, the light emitting device 10 has a stacked structure obtained by stacking a first conductive type layer 11, an active layer 12 and a second conductive type layer 13 in this order. In each of the light emitting device 10G and the light emitting device 10B, the first conductive type layer 11, the active layer 12 and the second conductive type layer 13 are made from typically semiconductor materials pertaining to the InGaN group. In the light emitting device 10R, on the other hand, the first conductive type layer 11, the active layer 12 and the second conductive type layer 13 are made from typically semiconductor materials pertaining to the AlGaInP group.

A first electrode 14 and a second electrode 15 are configured to include a metallic material having a high light reflectance. A typical example of such a metallic material is Ag (silver). It is to be noted that, as shown in none of the figures, every light emitting device 10 may have an insulation film for coating side surfaces and an area included in the upper surface as an area in which the first electrode 14 is not created.

Figure 3:
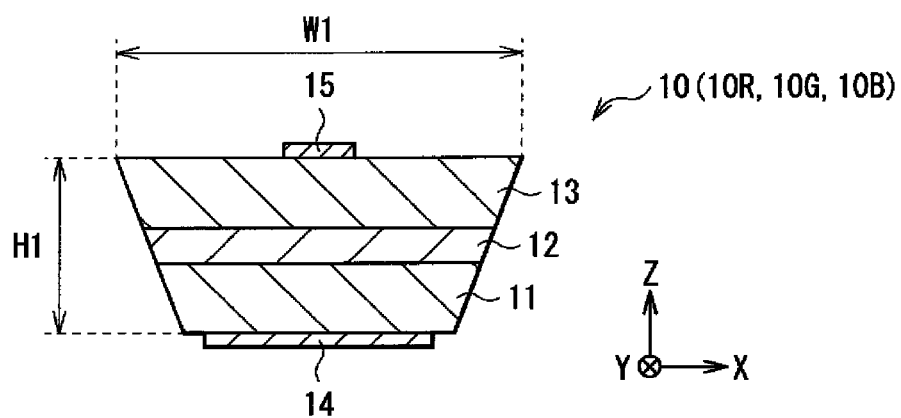
FIG. 3 is a cross-sectional diagram showing another typical configuration of the light emitting device employed in the light emitting apparatus shown in FIGS. 1A and 1B.

As shown in FIG. 2 for example, the side surfaces of the light emitting device 10 are surfaces perpendicularly intersecting with the stacking direction. It is to be noted that, taking the light fetching efficiency into consideration, the side surfaces of the light emitting device 10 can also be inclined surfaces intersecting with the stacking direction. As shown in FIG. 3 for example, the side surfaces of the light emitting device 10 can be inclined surfaces shaping the cross section of the light emitting device 10 into a reversed trapezoidal form.

As shown in FIGS. 2 and 3, the first electrode 14 is provided below the lower surface of the first conductive type layer 11. The first electrode 14 is brought into contact with the first conductive type layer 11 and electrically connected to the first conductive type layer 11. On the other hand, the second electrode 15 is provided on the upper surface of the second conductive type layer 13. The second electrode 15 is brought into contact with the second conductive type layer 13 and electrically connected to the second conductive type layer 13. Each of the first electrode 14 and the second electrode 15 can be configured as a single electrode or a plurality of electrodes. It is to be noted that, in the following description, each of the first electrode 14 and the second electrode 15 is assumed to be configured as a single electrode as shown in FIGS. 2 and 3.

As shown in FIGS. 1A and 1B, the light emitting apparatus 1 is provided with an insulator 20 having a chip shape for coating the light emitting device 10. In addition, as shown in FIGS. 1A and 1B, the light emitting apparatus 1 is also provided with terminal electrodes 31 and 32 as well as lines 33 and 34 for every light emitting device 10. It is to be noted that the line 33 is a typical concrete example of a second metal line of the embodiments of the present disclosure whereas the line 34 is a typical concrete example of a first metal line of the embodiments of the present disclosure.

Insulator 20

The insulator 20 holds the light emitting devices 10 and surrounds the light emitting devices 10 from at least a side and the upper surface of the light emitting device 10. The insulator 20 further has the lines 33 and 34 inside the insulator 20. That is to say, the lines 33 and 34 are embedded in the insulator 20. The insulator 20 is made from typically a resin material such as polyimide. It is to be noted that the insulator 20 can also be made by hardening transparent resin having a light resistance as well as a light-sensitive characteristic. The aspect ratio of the insulator 20 has a value smaller than 1. The aspect ratio of the insulator 20 is defined as the ratio of the height H2 of the insulator 20 to the width W2 of the upper surface of the insulator 20. The height H2 of the insulator 20 and the width W2 of the upper surface of the insulator 20 are shown in FIG. 2. From a standpoint of preventing the light emitting apparatus 1 from being oriented horizontally at the transfer time of the light emitting apparatus 1 in the manufacturing process, however, it is desirable to set the aspect ratio of the insulator 20 at a value not greater than ⅕. The height H2 of the insulator 20 is set at a typical value not smaller than 5 microns but not greater than 50 microns. On the other hand, the width W2 of the upper surface of the insulator 20 is set at a typical value not smaller than 10 microns but not greater than 100 microns.

As shown in FIGS. 1A and 1B for example, the insulator 20 has flat upper and lower surfaces. No structure elements are provided in particular on the upper surface of the insulator 20. The upper surface of the insulator 20 is exposed to the outside such as the air. On the lower surface of the insulator 20, on the other hand, the terminal electrodes 31 and 32 are provided. The terminal electrodes 31 and 32 are separated from each other by a predetermined gap in order to electrically disconnect the terminal electrodes 31 and 32 from each other.

The terminal electrodes 31 and 32 are created on the lower surface of the insulator 20 in such a way that the terminal electrodes 31 and 32 are provided on the same level. Each of the terminal electrodes 31 and 32 is made from a main material such as Cu (copper). At least a portion of the surface of each of the terminal electrodes 31 and 32 may be covered with a material that can be hardly converted into an oxide. A typical example of the material that can be hardly converted into an oxide is Au (gold). For example, the whole surface of each of the terminal electrodes 31 and 32 may be covered with a material which can be hardly converted into an oxide as is the case with Au and Ti. The terminal electrodes 31 and 32 play the roles of the input and output terminals of the light emitting apparatus 1 in addition to the role to reflect light emitted from the active layer 12 to the second conductive type layer 13.

The terminal electrode 31 is electrically connected to the first electrode 14 of the light emitting device 10 through a junction material 16. The junction material 16 is configured to compose of a plating metal created typically in a plating process. It is to be noted that the junction material 16 can also be created by adoption of a method other than the method based on the plating process. The terminal electrode 31 is also electrically connected to the line 33. The line 33 is provided at a position separated away from the second electrode 15 located on the upper surface of the light emitting device 10 by a predetermined gap in order to electrically disconnect the line 33 from the second electrode 15.

The line 33 is configured to include a plating metal. To put it concretely, the line 33 is made from a seed metal and a plating metal stacked on the upper surface of the seed metal. The seed metal is a metal created from Ti, Cu or the like by carrying out a film creation process such as a sputtering, PVD or CVD process. On the other hand, the plating metal is a metal created by carrying out a plating process which is one of film creation processes. It is to be noted that typical types of coating include electrolytic coating and non-electrolytic coating. The line 33 is a line created by carrying out a plating process. By selecting an optimum growth method, the line 33 can be created to have an electrically and mechanically stable structure. For example, the line 33 is created in a conformal way typically in order to result in a uniform film thickness. In addition, the line 33 can also be created to have a shape with a dented portion which is relatively thick in comparison with other portions. To put it concretely, the dented portion is a portion in the vicinity of a connection point C1 shown in FIG. 1B as a connection point to be described later.

The terminal electrode 32 is electrically connected to the second electrode 15 of the light emitting device 10 through the line 34. The line 34 is brought into contact with the second electrode 15 provided on the upper surface of the light emitting device 10 in order to electrically connect the line 34 to the second electrode 15. The line 34 is configured to include a plating metal. To put it concretely, the line 34 is made from a seed metal and a plating metal stacked on the upper surface of the seed metal. The seed metal is a metal created from Ti, Cu or the like by carrying out a film creation process such as a sputtering, PVD or CVD process. On the other hand, the plating metal is a metal created by carrying out a plating process which is one of film creation processes as is the case with the line 33. It is to be noted that typical types of coating include electrolytic coating and non-electrolytic coating. The line 34 is a line created by carrying out a plating process. By selecting an optimum growth method, the line 34 can be created to have an electrically and mechanically stable structure. For example, the line 34 is created in a conformal way typically in order to result in a uniform film thickness. In addition, the line 34 can also be created to have shape with a dented portion which is relatively thick in comparison with other portions. To put it concretely, the dented portion is a portion in the vicinity of a connection point C2 shown in FIG. 1B as a connection point to be described as follows.

The connection point C1 connecting the line 33 to the terminal electrode 31 and the connection point C2 connecting the line 34 to the terminal electrode 32 are provided at positions facing each other through the light emitting device 10. The line 33 is extended from the connection point C1 to the upper surface of the light emitting device 10. By the same token, the line 34 is extended from the connection point C2 to the upper surface of the light emitting device 10. The lines 33 and 34 are extended to intersect with the layout direction of the light emitting device 10. Typically, the lines 33 and 34 perpendicularly intersect with the layout direction of the light emitting device 10. The extension direction of the line 33 and the extension direction of the line 34 are typically parallel to each other.

Figure 4:
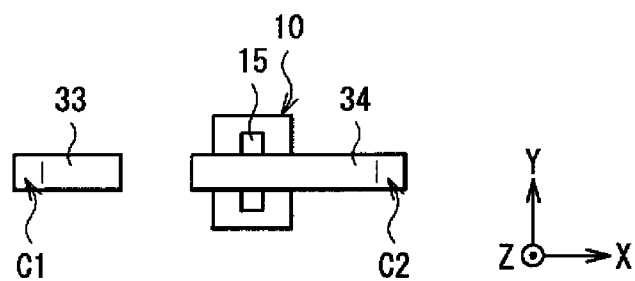
FIG. 4 is a cross-sectional diagram showing typical configurations of lines employed in the light emitting apparatus shown in FIGS. 1A and 1B.
Figure 5:
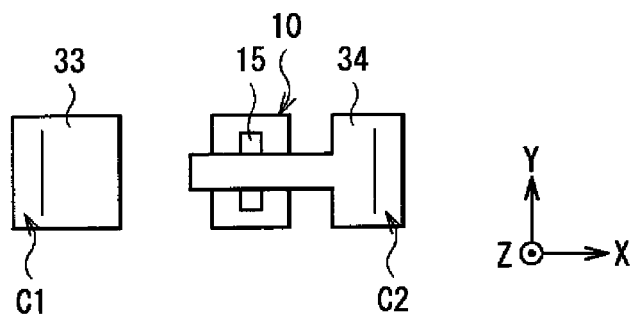
FIG. 5 is a cross-sectional diagram showing other typical configurations of the lines employed in the light emitting apparatus shown in FIGS. 1A and 1B.

Each of the lines 33 and 34 has a 3-dimensional shape that does not allow an air space to be created right below the lines 33 and 34 when the insulator 20 is created in the manufacturing process. As shown in FIG. 4, each of the lines 33 and 34 has a thin long band shape. It is to be noted, however, that each of the lines 33 and 34 does not have to have the shape shown in FIG. 4. As shown in FIG. 5 for example, the line 33 can have a shape in which only a portion in close proximity to the connection point C1 has a large width whereas the line 34 can have a shape in which only a portion in close proximity to the connection point C2 has a large width.

The insulator 20 is created to come into contact with the side surfaces of the light emitting device 10 and the upper surface of the light emitting device 10. The insulator 20 has a band shape extended in the layout direction of the light emitting device 10. For example, the insulator 20 has a cubic shape. The height H2 of the insulator 20 is greater than the height H1 of each light emitting device 10 whereas the width W2 of the upper surface of the insulator 20 is greater than the horizontal width W1 of each light emitting device 10. In addition, the distance D between the upper surface of the light emitting device 10 and the upper surface of the insulator 20 satisfies relation (1) given as follows.

$$D < [(W2-W1)/2]/\tan \theta m \quad (1)$$

In the above equation, the expression (W2−W1)/2 is the distance between a side surface of the light emitting device 10 and the facing side surface of the insulator 20 whereas notation θm denotes a critical angle on the upper surface of the insulator 20.

It is to be noted that, if the distance D is about equal to the difference H2−H1, notation D used in relation (1) given above may be replaced with notation (H2−H1).

Figure 6:
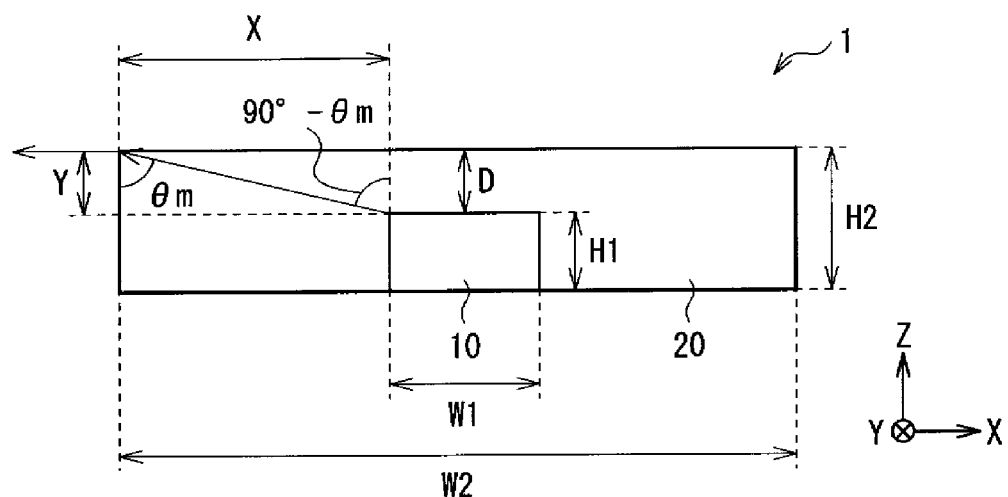
FIG. 6 is an explanatory model diagram to be referred to in description of the heights of the light emitting device and an insulator which are employed in the light emitting apparatus shown in FIGS. 1A and 1B as well as the widths of the light emitting device and the insulator.

If the distance D satisfies relation (1) given above, typically, all light rays included in light originating from the upper surface of the light emitting device 10 and emitted at angles smaller than an emanation angle of (90 degrees−θm) hit the upper surface of the insulator 20 as shown in the model diagram of FIG. 6. Thus, in this case, the light fetching efficiency increases.

Manufacturing Method

Next, a typical method for manufacturing the light emitting apparatus 1 according to the embodiment is described as follows.

Figure 7A:
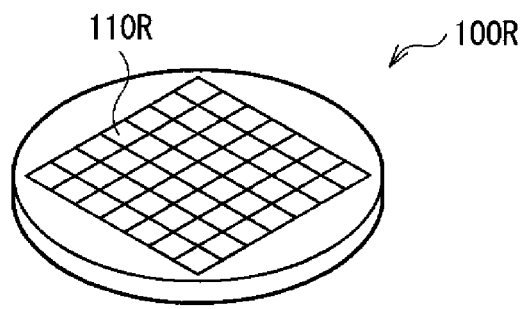
FIGS. 7A to 7C are a plurality of perspective-view diagrams each showing a typical wafer used in a process of manufacturing the light emitting apparatus shown in FIGS. 1A and 1B.

First of all, a wafer 100R on which a number of portions each included in the light emitting device 10R as a portion other than the second electrode 15 have been created is prepared on a crystal growing substrate as shown in FIG. 7A. The portions each included in the light emitting device 10R as a portion other than the second electrode 15 are referred to hereafter as a light emitting device 110R.

Figure 7B:
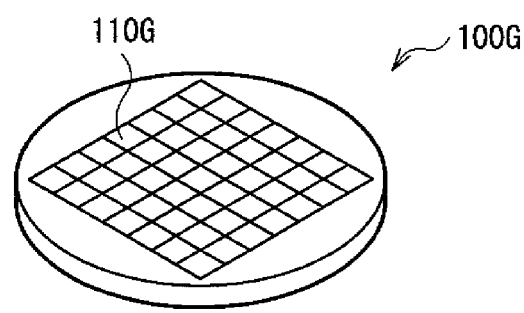

Then, a wafer 100G on which a number of portions each included in the light emitting device 10G as a portion other than the second electrode 15 have been created is prepared on the crystal growing substrate as shown in FIG. 7B. The portions each included in the light emitting device 10G as a portion other than the second electrode 15 are referred to hereafter as a light emitting device 110G.

Figure 7C:
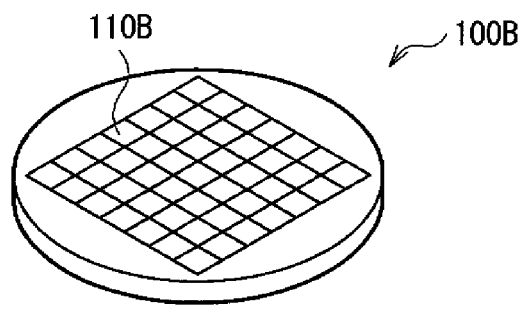

Subsequently, a wafer 100B on which a number of portions each included in the light emitting device 10B as a portion other than the second electrode 15 have been created is prepared on the crystal growing substrate as shown in FIG. 7C. The portions each included in the light emitting device 10B as a portion other than the second electrode 15 are referred to hereafter as a light emitting device 110B.

It is to be noted that each of the light emitting device 110R, the light emitting device 110G and the light emitting device 110B forms a laminated structure including the second conductive type layer 13, the active layer 12, the first conductive type layer 11 and the first electrode 14 which are stacked from the side of the crystal growing substrate in the order the second conductive type layer 13, the active layer 12, the first conductive type layer 11 and the first electrode 14 are enumerated in this sentence.

Figure 8A:
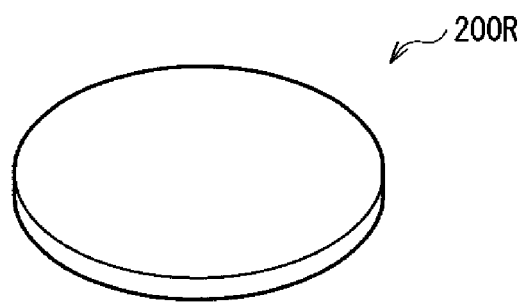
FIGS. 8A to 8C are a plurality of perspective-view diagrams each showing a typical temporarily fixing substrate used in the process of manufacturing the light emitting apparatus shown in FIGS. 1A and 1B.
Figure 8B:
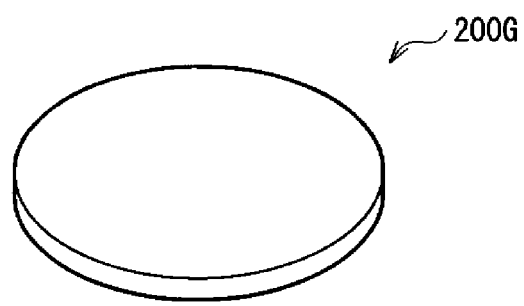
Figure 8C:
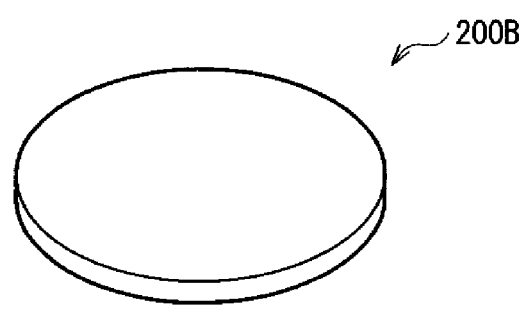

Then, a temporarily fixing substrate 200R shown in FIG. 8A is prepared to serve as a substrate used for temporarily fixing all the light emitting devices 110R on the wafer 100R. By the same token, a temporarily fixing substrate 200G shown in FIG. 8B is prepared to serve as a substrate used for temporarily fixing all the light emitting devices 110G on the wafer 100G. In the same way, a temporarily fixing substrate 200B shown in FIG. 8C is prepared to serve as a substrate used for temporarily fixing all the light emitting devices 110B on the wafer 100B. Typically, the temporarily fixing substrate 200R, the temporarily fixing substrate 200G and the temporarily fixing substrate 200B are each a substrate created by laying an unhardened bonding layer on a transparent substrate such as a quartz substrate or a sapphire substrate.

Then, after the wafer 100R and the temporarily fixing substrate 200R have been pasted on each other so that the light emitting devices 110R on the wafer 100R are brought into contact with the bonding layer on the temporarily fixing substrate 200R, the bonding layer is hardened. Subsequently, the substrate of the wafer 100R is removed typically by carrying out a lapping process so as to expose the second conductive type layer 13. Afterwards, the second electrode 15 is created on the exposed second conductive type layer 13. Then, a dry etching process is carried out for period units of the second electrode 15 in order to spatially separate semiconductor layers composed of the second conductive type layer 13, the active layer 12 and the first conductive type layer 11. In this way, a plurality of light emitting devices 10R are created on the temporarily fixing substrate 200R.

By the same token, after the wafer 100G and the temporarily fixing substrate 200G have been pasted on each other so that the light emitting devices 110G on the wafer 100G are brought into contact with the bonding layer on the temporarily fixing substrate 200G, the bonding layer is hardened. Subsequently, the substrate of the wafer 100G is removed typically by carrying out a laser radiation process so as to expose the second conductive type layer 13. Afterwards, the second electrode 15 is created on the exposed second conductive type layer 13. Then, a dry etching process is carried out for period units of the second electrode 15 in order to spatially separate semiconductor layers composed of the second conductive type layer 13, the active layer 12 and the first conductive type layer 11. In this way, a plurality of light emitting devices 10G are created on the temporarily fixing substrate 200G.

In the same way, after the wafer 100B and the temporarily fixing substrate 200B have been pasted on each other so that the light emitting devices 110B on the wafer 100B are brought into contact with the bonding layer on the temporarily fixing substrate 200B, the bonding layer is hardened. Subsequently, the substrate of the wafer 100B is removed typically by carrying out a laser radiation process so as to expose the second conductive type layer 13. Afterwards, the second electrode 15 is created on the exposed second conductive type layer 13. Then, a dry etching process is carried out for period units of the second electrode 15 in order to spatially separate semiconductor layers composed of the second conductive type layer 13, the active layer 12 and the first conductive type layer 11. In this way, a plurality of light emitting devices 10B are created on the temporarily fixing substrate 200B.

Figure 9:
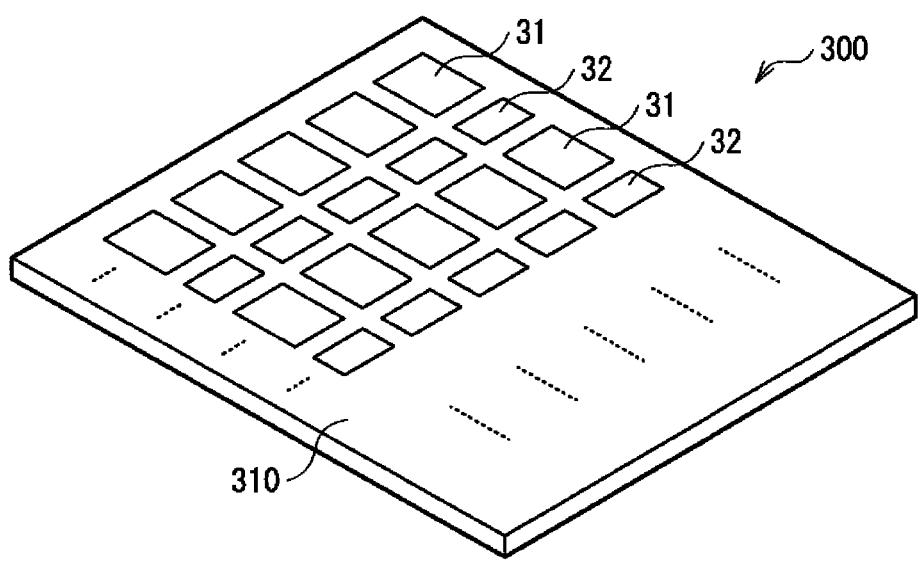
FIG. 9 is a perspective-view diagram showing a typical wiring substrate used in the process of manufacturing the light emitting apparatus shown in FIGS. 1A and 1B.

Then, a wiring substrate 300 shown in FIG. 9 is prepared to serve as a substrate on which the light emitting devices 10R, 10G and 10B are to be mounted. The wiring substrate 300 is a substrate created by laying out a plurality of terminal-electrode pairs each composed of the terminal electrodes 31 and 32 on a transparent substrate 310 such as a quartz substrate. Subsequently, on the terminal electrode 31 of the wiring substrate 300, the light emitting devices 10R, 10G and 10B are mounted.

Figure 10A:
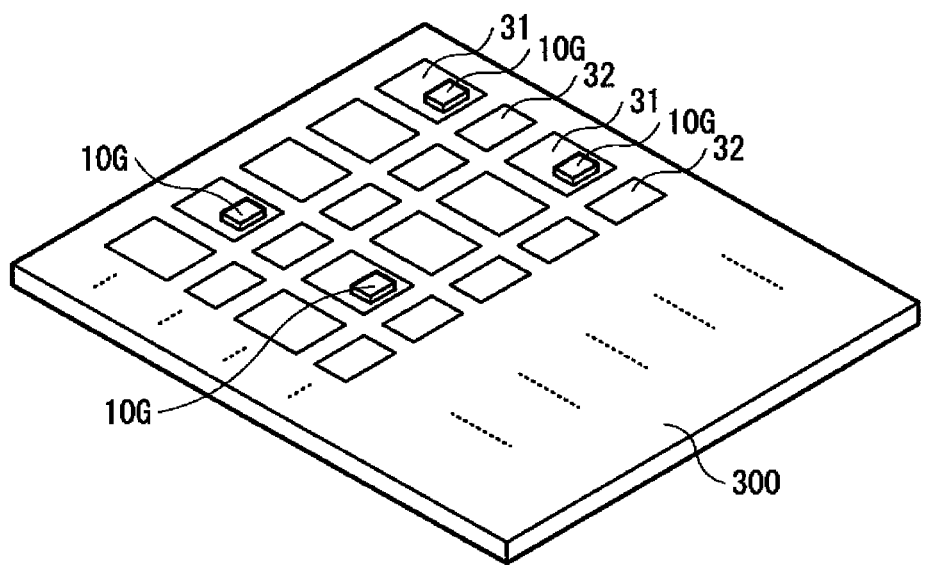
FIG. 10A is an explanatory perspective-view diagram to be referred to in description of a process of manufacturing the light emitting apparatus shown in FIGS. 1A and 1B.
Figure 10B:
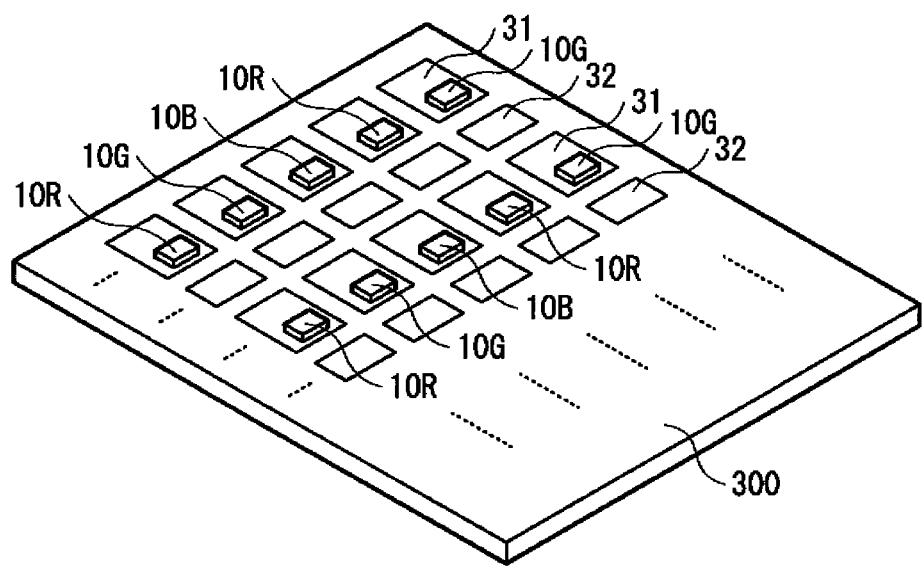
FIG. 10B is an explanatory perspective-view diagram to be referred to in description of a process serving as the continuation of the process explained earlier by referring to FIG. 10A.
Figure 10C:
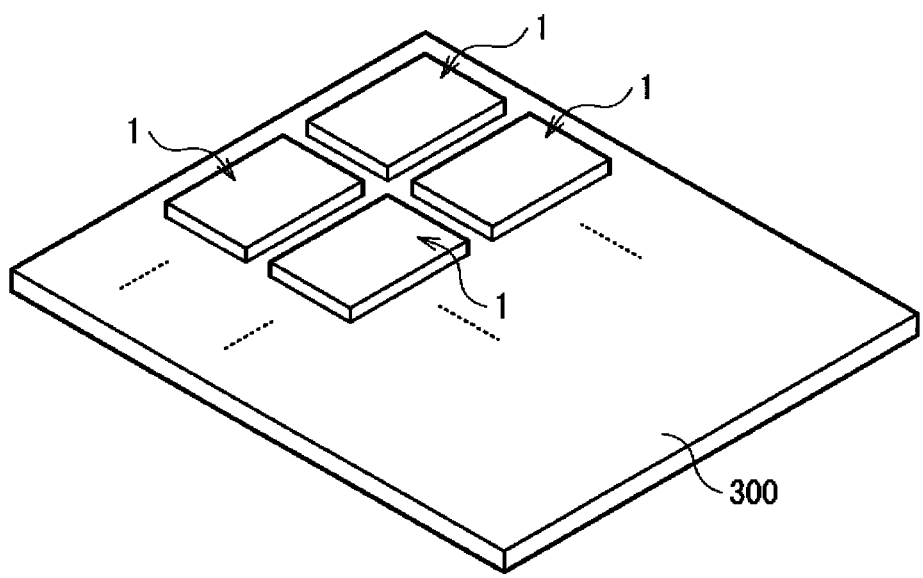
FIG. 10C is an explanatory perspective-view diagram to be referred to in description of a process serving as the continuation of the process explained earlier by referring to FIG. 10B.

First of all, the light emitting device 10G on the temporarily fixing substrate 200G is transferred to the surface of the wiring substrate 300. For example, a mounting tool is used for taking out the light emitting device 10G from the temporarily fixing substrate 200G and mounting the light emitting device 10G on the surface of the wiring substrate 300 as shown in FIG. 10A. By the same token, the light emitting device 10R is taken out from the temporarily fixing substrate 200R and then mounted on the wiring substrate 300 whereas the light emitting device 10B is taken out from the temporarily fixing substrate 200B and then mounted on the wiring substrate 300 as shown in FIG. 10B. Later on, the lines 33 and 34 as well as the insulator 20 are created. As a result, a plurality of light emitting apparatus 1 are created on the wiring substrate 300 as shown in FIG. 10C.

Next, the following description explains details of a series of procedures for creating the lines 33 and 34 as well as the insulator 20.

Figure 11A:
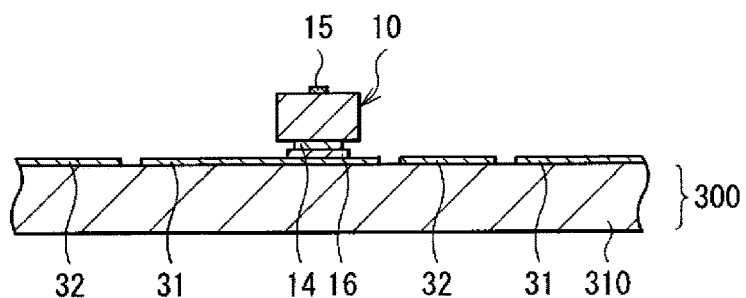
FIGS. 11A to 11D are a plurality of explanatory cross-sectional diagrams to be referred to in description of details of the process explained earlier by referring to FIG. 10C.
Figure 11B:
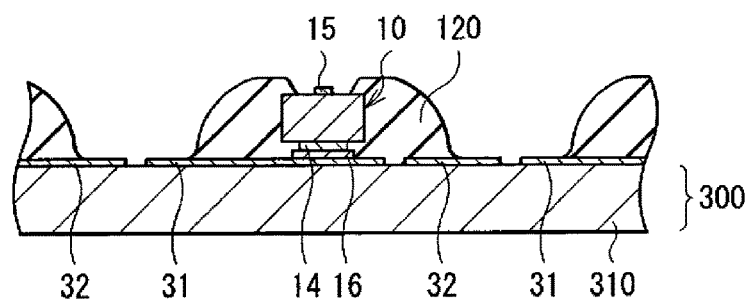

First of all, by adoption of the transfer method explained above, the light emitting device 10 is mounted on the terminal electrode 31 as shown in FIG. 11A. Then, after a photo-resist layer shown in none of the figures has been created on the entire surface including the light emitting device 10, exposure and development processes are carried out in order to create a sacrifice layer 120 which covers the side surfaces of the light emitting device 10 as well as portions of the upper surfaces of the terminal electrodes 31 and 32 as shown in FIG. 11B. Later on, if necessary, a dry-etching process may be carried out on the entire surface in order to adjust the height of the sacrifice layer 120.

It is to be noted that, by carrying out a reflow process on the sacrifice layer 120, a round shape like one shown in FIG. 11B can be created on the upper surface of the sacrifice layer 120. As an alternative, by carrying out an exposure process making use of a grey scale mask on the sacrifice layer 120, a round shape can also be created on the upper surface of the sacrifice layer 120.

Figure 11C:
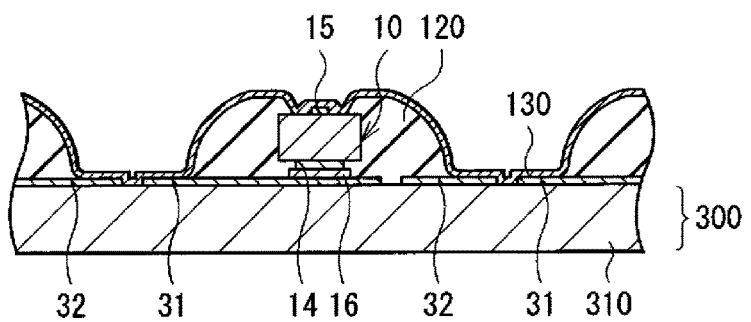
Figure 11D:
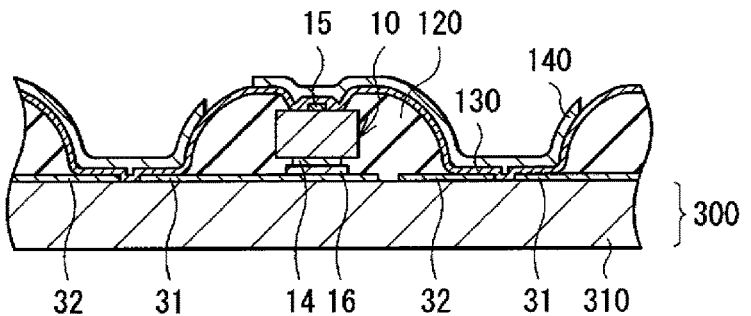

Then, typically, a sputtering process is carried out in order to create a seed metal 130 on the entire surface including the sacrifice layer 120 as shown in FIG. 11C. If Ti and Cu are sequentially sputtered in the sputtering process for example, the seed metal 130 is created to have a two-layer structure composed of Ti and Cu layers.

Subsequently, a plating metal 140 is stacked in a predetermined area on the upper surface of the seed metal 130 as shown in FIG. 14D. For example, after a mask having apertures in areas in which the lines 33 and 34 are to be created later has been created, a plating process making use of typically Cu is carried out in order to stack the plating metal 140 on the seed metal 130.

Figure 11E:
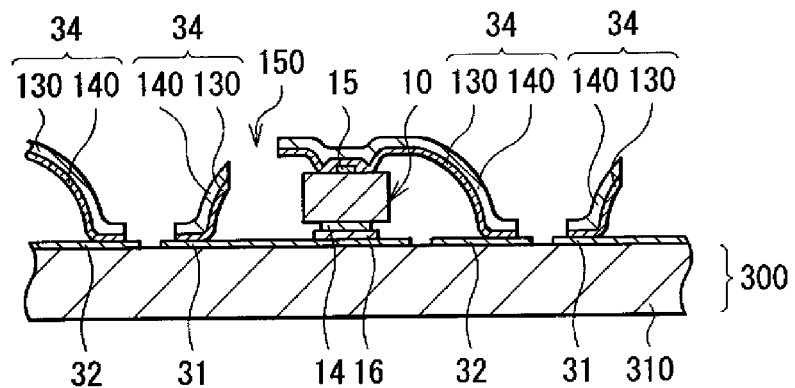
FIGS. 11E to 11G are a plurality of explanatory cross-sectional diagrams to be referred to in description of details of a process serving as the continuation the process explained earlier by referring to FIGS. 11A to 11D.

Then, unnecessary portions of the seed metal 130 and the sacrifice layer 120 are removed as shown in FIG. 11E. Thus, a hollow cavity is created in a member occupied before by the removed sacrifice layer 120. As a result, remaining portions of the seed metal 130 are separated from each other, resulting in a gap 150. To be more specific, the gap 150 is formed between a remaining portion pertaining to the seed metal 130 to serve as a portion connected to the terminal electrode 32 and a remaining portion pertaining to the seed metal 130 to serve as a portion connected to the terminal electrode 31. As a result, a laminated portion, which is composed of the remaining portion pertaining to the seed metal 130 to serve as a portion connected to the terminal electrode 32 and the plating metal 140, forms the line 34. On the other hand, a laminated portion, which is composed of the remaining portion pertaining to the seed metal 130 to serve as a portion connected to the terminal electrode 31 and the plating metal 140, forms the line 33.

Figure 11F:
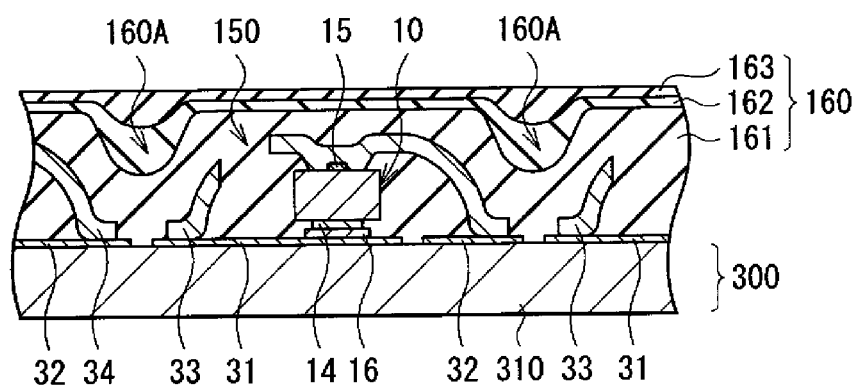

Then, typically, a spin coat method is adopted in order to create a transparent resin layer 160 so that the light emitting device 10, the line 34 and the line 33 are embedded in the transparent resin layer 160 as shown in FIG. 11F. In this process of creating the transparent resin layer 160 by adoption of the spin coat method, the transparent resin layer 160 may be created by dividing the transparent resin layer 160 into a plurality of transparent resin layers created sequentially at different times. For example, the transparent resin layer 160 is divided into typically three transparent resin layers 161, 162 and 163 as shown in FIG. 11F. In this case, first of all, the transparent resin layer 161 is created as a layer in which the light emitting device 10, the line 34 and the line 33 are embedded. Then, the transparent resin layer 162 is created to serve as a layer for filling up a dented portion 160A of the transparent resin layer 161. Subsequently, the transparent resin layer 163 is created to serve as a layer for making the upper surface flat. In this way, the transparent resin layer 160 composed of the three transparent resin layers 161, 162 and 163 can be created. Later on, the transparent resin layer 160 is hardened. Thus, the insulator 20 is created.

Figure 11G:
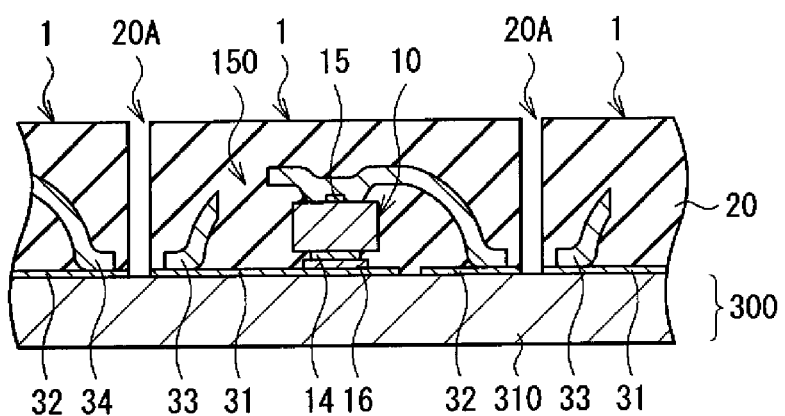

Then, the sacrifice layer 120 is divided into portions each allocated to one light emitting device 10 or a plurality of light emitting devices 10 as shown in FIG. 11G. For example, a photolithography technique or a milling technique is adopted in order to create a grove 20A penetrating the insulator 20 through a part between the line 33 and the line 34 and avoiding the gap 150 in the insulator 20. In this way, the sacrifice layer 120 is divided into portions and a light emitting apparatus 1 including a resulting portion of the sacrifice layer 120 is created.

Mounting Method

Next, the following description explains a typical method for mounting light emitting apparatus 1, which have been created on a wiring substrate 300, on a wiring substrate 400 included in a display panel or an illumination panel.

First of all, a temporarily fixing substrate shown in none of the figures is prepared to serve as a substrate for temporarily fixing all light emitting apparatus 1 created on the wiring substrate 300. The temporarily fixing substrate used for temporarily fixing light emitting apparatus 1 is typically a substrate created by laying an unhardened bonding layer on a transparent substrate such as a quartz substrate.

Figure 12A:
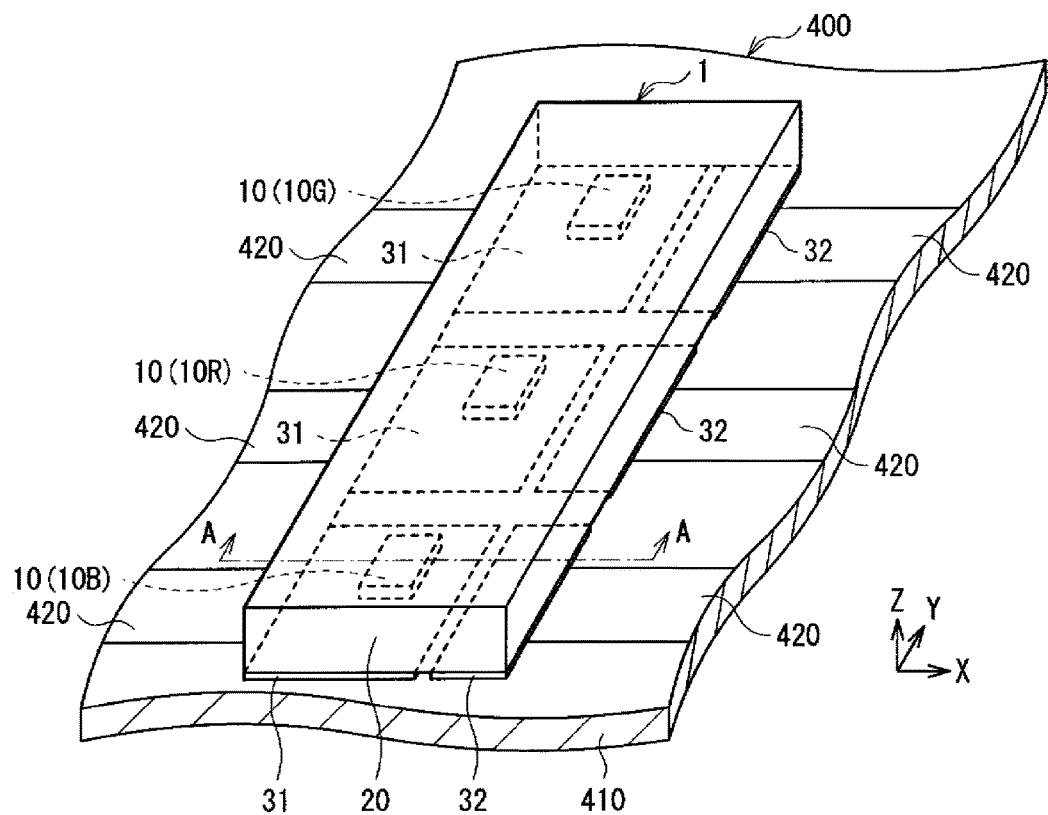
FIGS. 12A and 12B are perspective-view and cross-sectional diagrams showing a state in which the light emitting apparatus 1 has been mounted on a wiring substrate.

Then, a wiring substrate 400 is prepared to serve as a substrate on which light emitting apparatus 1 are to be mounted. The wiring substrate 400 is a support substrate 410 having, among others, a plurality of electrode pads 420 provided on the support substrate 410 as shown in FIG. 12A. In addition, the wiring substrate 400 also has typically soldering paste on the electrode pads 420. The soldering paste itself is not shown in FIG. 12A.

Figure 12B:
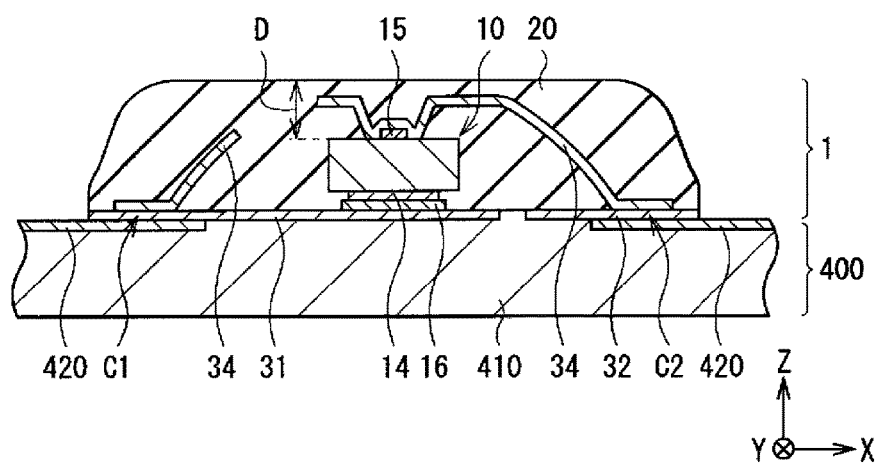

Then, after the wiring substrate 300 and the temporarily fixing substrate have been pasted on each other so that the light emitting apparatus 1 on the wiring substrate 300 are brought into contact with the bonding layer on the temporarily fixing substrate, the bonding layer is hardened. Subsequently, the transparent substrate 310 is removed and the light emitting apparatus 1 are separated from each other. Then, the light emitting apparatus 1 separated from each other are mounted on the wiring substrate 400. For example, after the wiring substrate 400 and the temporarily fixing substrate have been pasted on each other so that the light emitting apparatus 1 separated from each other on the temporarily fixing substrate are brought into contact with the wiring substrate 400, the light emitting apparatus 1 are peeled off from the temporarily fixing substrate. As a result, the light emitting apparatus 1 are mounted on typically the electrode pads 420 of the wiring substrate 400 through the soldering paste as shown in FIGS. 12A and 12B. Then, typically, a reflow process is carried out on the wiring substrate 400 in order to fix the light emitting apparatus 1 on the wiring substrate 400. In this way, the light emitting apparatus 1 can be mounted on the wiring substrate 400.

Effects

Next, effects of the light emitting apparatus 1 according to the first embodiment are explained as follows.

In accordance with the first embodiment, the line 34 for electrically connecting the second electrode 15 provided on the upper surface of the light emitting device 10 and the terminal electrode 32 of the light emitting apparatus 1 to each other is a line created in a film creation process such as a plating process in place of a wire bonding process. Thus, the line 34 can be embedded in the insulator 20 in which the light emitting device 10 is embedded. As a result, the thickness of the light emitting apparatus 1 can be reduced without decreasing the yield of what is obtained from a wafer and the transfer-time yield.

In addition, in accordance with the first embodiment, the line 33 electrically connected to the terminal electrode 31 and extended toward the upper surface of the light emitting device 10 is also a line created in a film creation process such as a plating process in place of a wire bonding process. Thus, the line 33 can also be embedded in the insulator 20 in which the light emitting device 10 is embedded. As a result, the thickness of the light emitting apparatus 1 can be reduced without decreasing the yield of what is obtained from a wafer and the transfer-time yield. In addition, in comparison with a configuration including no line 33, the upper surface of the insulator 20 can be made flat over a broader range.

On top of that, in accordance with the first embodiment, each of the lines 33 and 34 is a line created in a film creation process such as a plating process as described above. Thus, by selecting a proper film creation method, it is possible to do things such as creation of the lines 33 and 34 in a conformal way in spite of the very fine structures of the lines 33 and 34 and creation of the lines 33 and 34 each including a dented portion slightly thicker than required. As a result, the structure of each of the lines 33 and 34 can be made stable electrically and mechanically.

In addition, in accordance with the first embodiment, each of the lines 33 and 34 has a 3-dimensional shape that does not allow an air space to be created right below the lines 33 and 34 when the insulator 20 is created in the manufacturing process. Thus, it is possible to prevent the light fetching efficiency from decreasing due to, among other causes, the fact that light emanating from the light emitting device 10 is scattered in such an air space.

On top of that, in accordance with the first embodiment, the heights of the light emitting device 10 and the insulator 20 as well as the widths of the light emitting device 10 and the insulator 20 satisfy the relation described earlier. Thus, a high light fetching efficiency can be implemented.

2: Typical Modified Versions of the First Embodiment

First Modified Version

Figure 13:
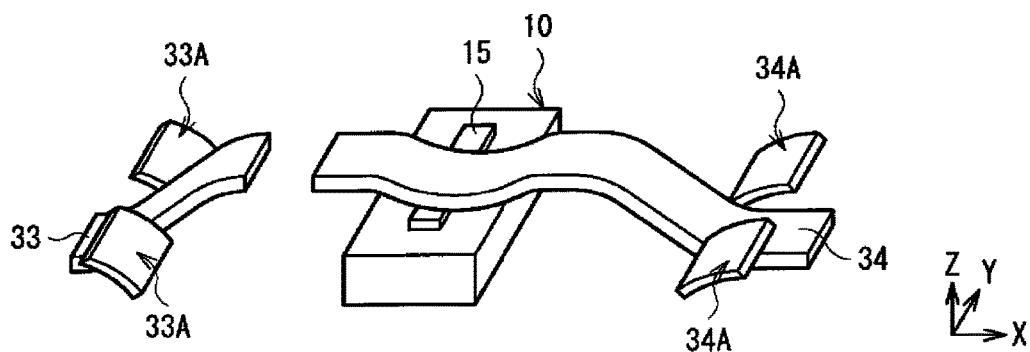
FIG. 13 is a perspective-view diagram showing a typical modified version of the lines employed in the light emitting apparatus shown in FIGS. 1A and 1B.
Figure 14:
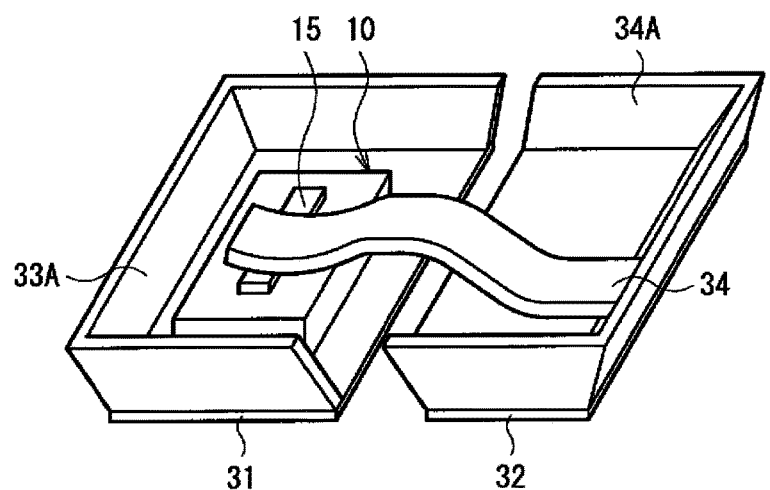
FIG. 14 is a perspective-view diagram showing another typical modified version of the lines employed in the light emitting apparatus shown in FIGS. 1A and 1B.

In the case of the embodiment described above, each of the lines 33 and 34 is extended toward the upper surface of the light emitting device 10. In addition, as shown in FIG. 13 for example, the line 33 may be provided with protrusions 33A at a location separated away from the light emitting device 10 in a direction departing from the light emitting device 10 whereas the line 34 may be provided with protrusions 34A at a location separated away from the light emitting device 10 in a direction departing from the light emitting device 10. On top of that, as shown in FIG. 14 for example, the protrusions 33A and 34A may be created to enclose the surroundings of the light emitting device 10. It is to be noted that, if the protrusions 33A and 34A are created to enclose the surroundings of the light emitting device 10, it is possible to provide a portion included in the line 33 as a portion extended to the side of the light emitting device 10 or eliminate such a portion as shown in FIG. 14. In such a configuration, light emanating from a side surface of the light emitting device 10 is reflected by the protrusions 33A and 33B to the upper surface of the light emitting apparatus 1 and emitted to the outside from the upper surface of the light emitting apparatus 1. Thus, an even higher light fetching efficiency can be implemented.

Second Modified Version

Figure 15:
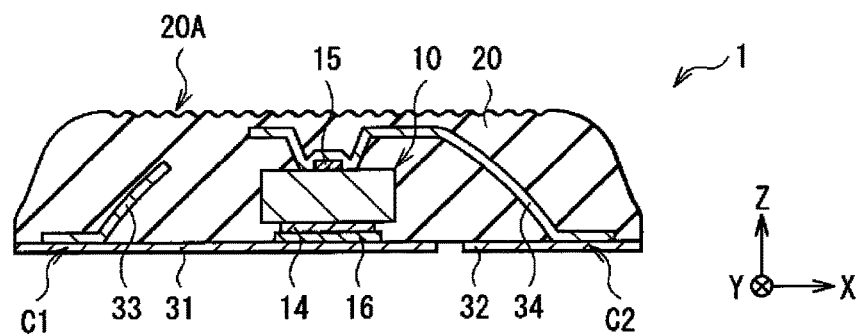
FIG. 15 is a cross-sectional diagram showing a typical modified version of the insulator employed in the light emitting apparatus shown in FIGS. 1A and 1B.

In addition, in the case of the first embodiment and the first modified version, the upper surface of the insulator 20 is all but flat. However, as shown in FIG. 15 for example, the upper surface of the insulator 20 can be a rough surface 20A. If the upper surface of the insulator 20 is a rough surface 20A, light radiated from the light emitting device 10 in an inclined direction is easily refracted and transmitted. Thus, an even higher light fetching efficiency can be implemented.

Third Modified Version

Figure 16A:
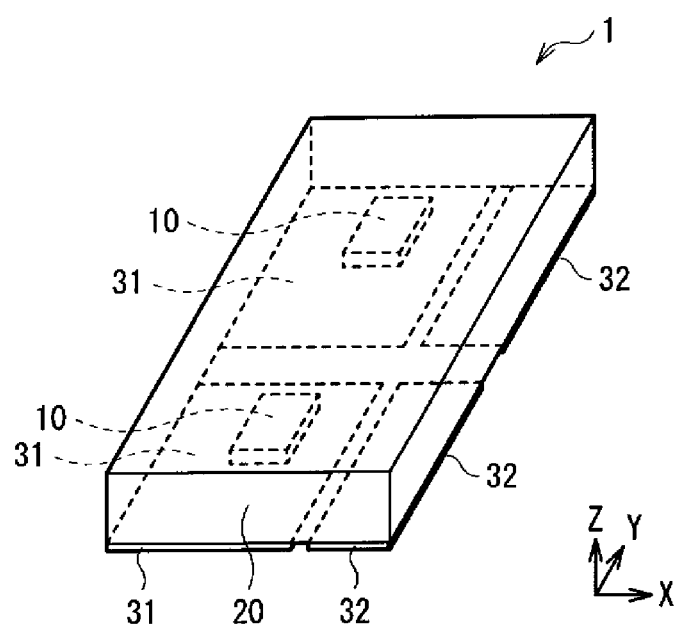
FIGS. 16A and 16B are a plurality of perspective-view diagrams each showing a typical modified version of the light emitting apparatus shown in FIGS. 1A and 1B.
Figure 16B:
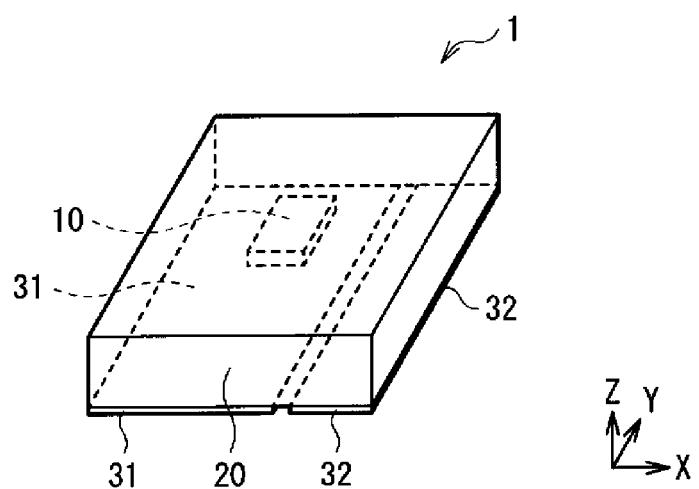

In addition, in the case of the first embodiment as well as the first and second modified versions, the light emitting apparatus 1 has three light emitting devices 10. However, the light emitting apparatus 1 may also be provided with one, two or at least four light emitting devices 10. As shown in FIG. 16A for example, the light emitting apparatus 1 is provided with two light emitting devices 10. As shown in FIG. 16B, on the other hand, the light emitting apparatus 1 is provided with only one light emitting device 10.

Fourth Modified Version

Figure 17A:
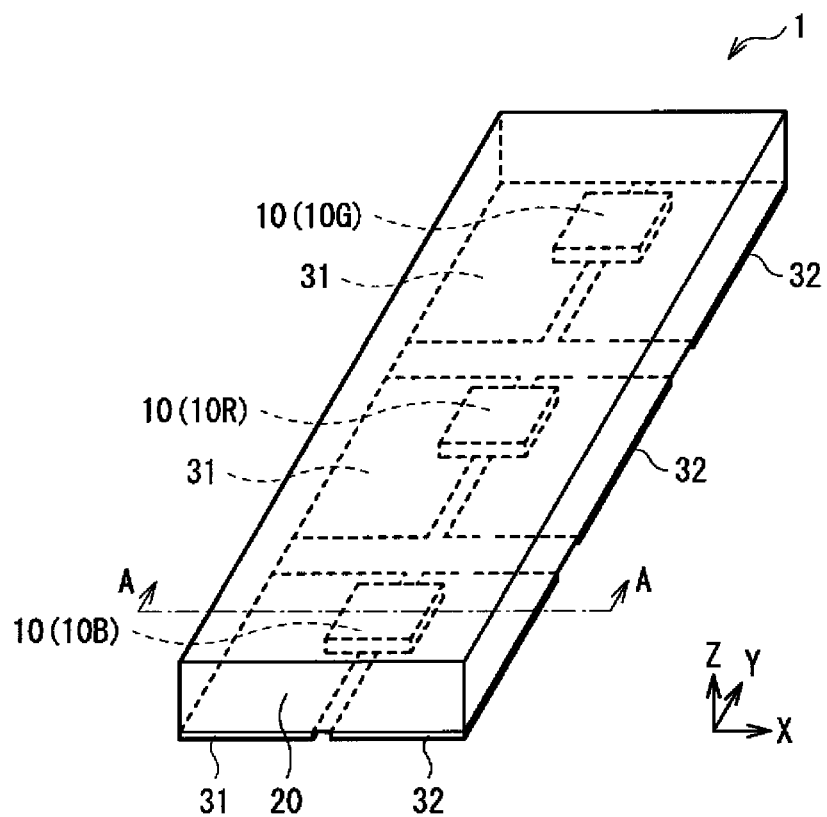
FIGS. 17A and 17B are perspective-view and cross-sectional diagrams each showing another typical configuration of the light emitting apparatus shown in FIGS. 1A and 1B.
Figure 17B:
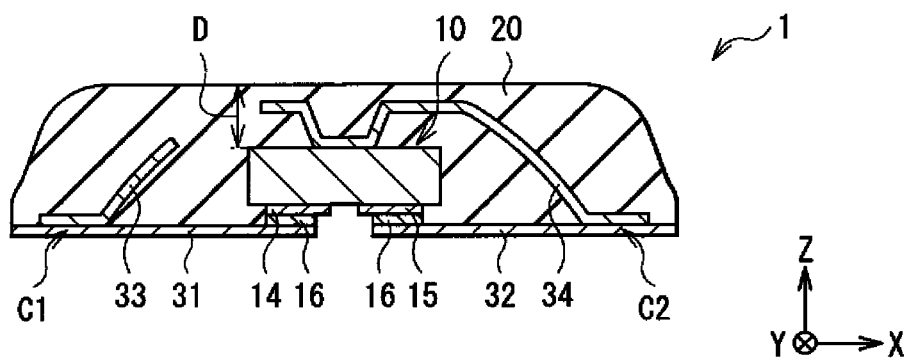

In addition, in the case of the first embodiment and the first to third modified versions, the second electrode 15 is created on the upper surface of the light emitting device 10. However, as shown in FIGS. 17A and 17B for example, the second electrode 15 may be created on the lower surface of the light emitting device 10. In the case of this fourth modified version, the light emitting device 10 has a flip-chip structure. In addition, the line 34 is no longer brought into direct contact with the second electrode 15. Instead, the terminal electrode 32 is brought into direct contact with the second electrode 15.

3: Second Embodiment

Configuration

Figure 18:
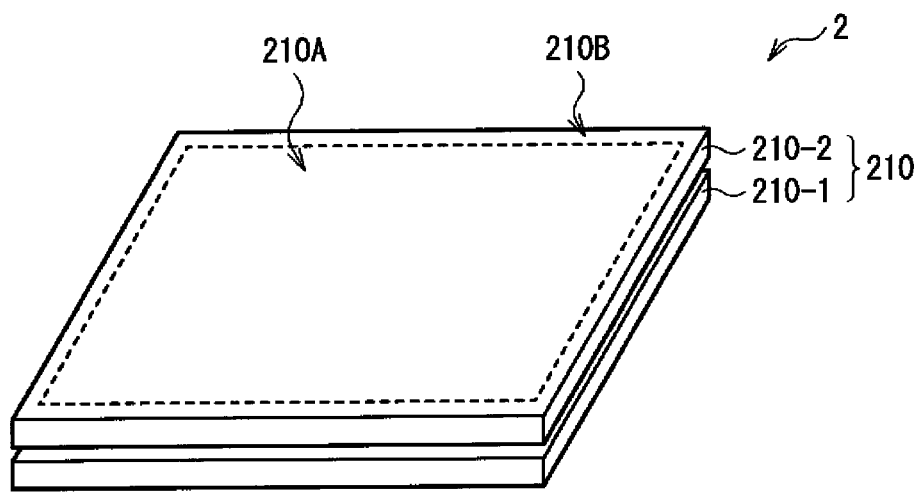
FIG. 18 is a perspective-view diagram showing a typical configuration of a display apparatus according to a second embodiment of the present disclosure.

Next, a display apparatus 2 according to a second embodiment of the present disclosure is explained as follows. In the display apparatus 2, the light emitting apparatus 1 according to the first embodiment described so far or according to a modified version of the first embodiment is used as a display pixel. FIG. 18 is a perspective-view diagram showing a typical rough configuration of the display apparatus 2 according to the second embodiment of the present disclosure. The display apparatus 2 is referred to as the so-called LED display apparatus in which an LED is used in each display pixel. As shown in FIG. 18 for example, the display apparatus 2 employs a display panel 210 and a driving circuit which is used for driving the display panel 210 but not shown in FIG. 18.

Display Panel 210

The display panel 210 has a mounting substrate 210-1 and a transparent substrate 210-2 which are superposed on each other. The surface of the transparent substrate 210-2 is used as a video display screen having a display area 210A at the center portion thereof. The portion surrounding the display area 210A is a frame area 210B which is a non-display area.

Figure 19:
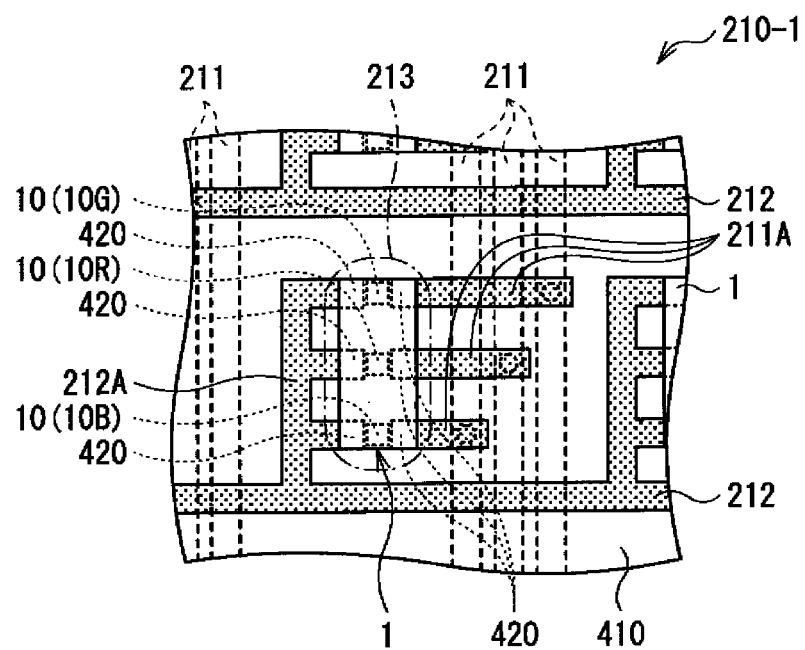
FIG. 19 is a top-view diagram showing a typical layout on the surface of a mounting substrate employed the display apparatus shown in FIG. 18.
Figure 20A:
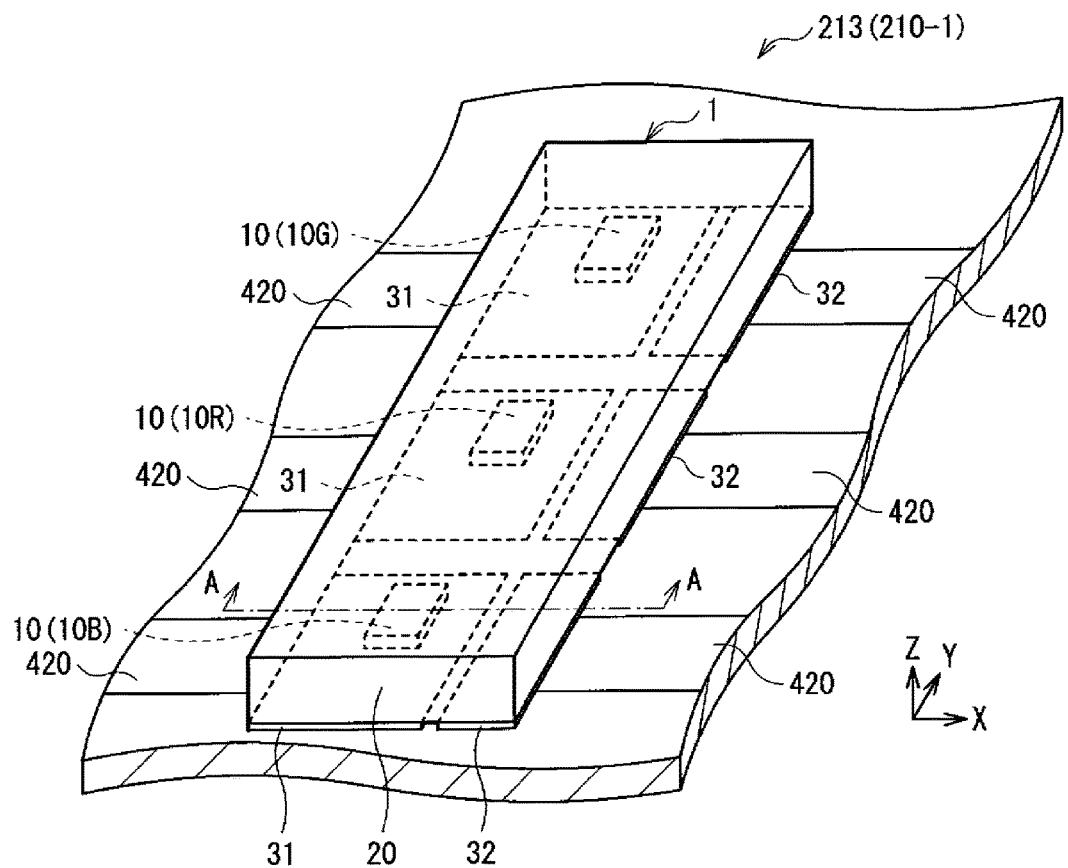
FIGS. 20A and 20B are perspective-view and cross-sectional diagrams each showing a typical configuration of a display pixel on the layout shown in FIG. 19.
Figure 20B:
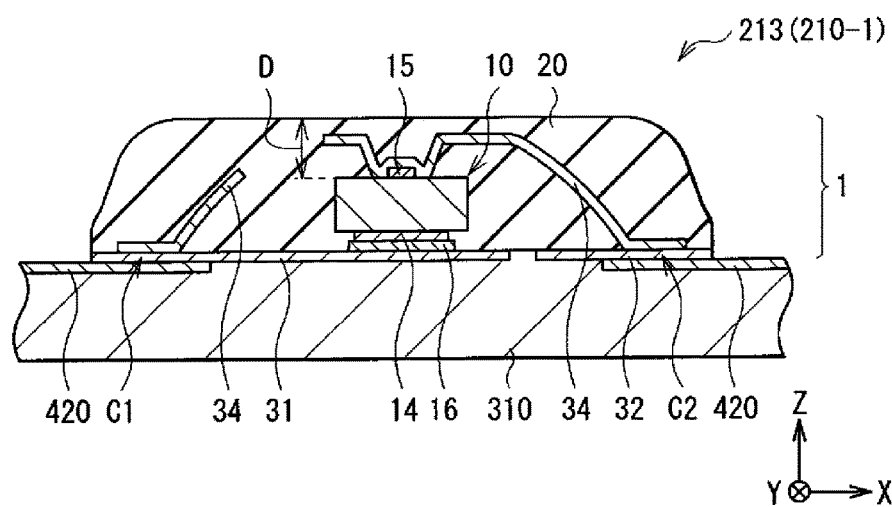

FIG. 19 is a top-view diagram showing a typical layout of an area on a surface of the mounting substrate 210-1. This surface of the mounting substrate 210-1 is a surface exposed to the transparent substrate 210-2. This area is an area corresponding to the display area 210A. FIG. 20A is an enlarged perspective-view diagram showing a typical configuration of a display pixel 213 on the layout shown in FIG. 19 whereas FIG. 20B is a diagram showing the configuration of a cross section indicated by an arrow A-A in FIG. 20A as a cross section of the display pixel 213.

Mounting Substrate 210-1

An area in the surface of the mounting substrate 210-1 corresponds to the display area 210A. In this area, typically, a plurality of parallel data lines 211 are created, being stretched in a direction determined in advance as shown in FIG. 19. In addition, the parallel data lines 211 are separated from each other at a pitch also determined in advance. On top of that, in this area existing in the surface of the mounting substrate 210-1 and corresponding to the display area 210A, a plurality of parallel scan lines 212 are also typically created, being stretched in a direction intersecting with the data lines 211. For example, the scan lines 212 are stretched in a direction perpendicular to the data lines 211. In addition, the parallel scan lines 212 are separated from each other at a pitch determined in advance. Each of the data lines 211 and the scan lines 212 is made from a conductive material such as Cu (copper).

The scan line 212 is created typically on an outermost layer. For example, the scan line 212 is created on an insulation layer created on the surface of a base material of the mounting substrate 210-1. The insulation layer itself is shown in none of the figures. The base material of the mounting substrate 210-1 is typically a glass substrate, a resin substrate or another substrate. The insulation layer created on the surface of the base material is made from typically SiN, $SiO_2$ or $Al_2O_3$.

On the other hand, the data line 211 is created in a layer different from the outermost layer on which the scan line 212 is created. For example, the data line 211 is created in a layer below the outermost layer. To be more specific, the data line 211 is created in typically an insulation layer above the base material.

On the surface of the insulation layer, typically, blacks are provided if necessary in addition to the scan line 212. A black is used for improving contrast and made from a material having a light absorption property. Typically, the black is created in at least an area in which no electrode pad 420 is created. The area in which no electrode pad 420 is created is an area on the surface of the insulation layer. It is to be noted that, if necessary, the blacks can be omitted.

The vicinity of an intersection of a data line 211 and scan line 212 is allocated to a display pixel 213. A plurality of display pixels 213 are laid out in the display area 210A to form a matrix. As shown in FIG. 19 for example, the display pixel 213 is a light emitting apparatus 1 including a plurality of light emitting devices 10. It is to be noted that FIG. 19 shows a typical configuration in which the light emitting apparatus 1 serving as a display pixel 213 has three light emitting devices 10 which are light emitting devices 10R, 10G and 10B. In this configuration, the light emitting device 10R emits light having a red color, the light emitting device 10G emits light having a green color whereas the light emitting device 10B emits light having a blue color. In this case, the light emitting device 10 is typically an LED chip.

As shown in FIGS. 20A and 20B for example, the light emitting apparatus 1 is provided with a terminal-electrode pair composed of terminal electrodes 31 and 32 for each of the light emitting devices 10 included in the light emitting apparatus 1. The terminal electrode 31 is electrically connected to the data line 211 whereas the terminal electrode 32 is electrically connected to the scan line 212. To put it in detail, the terminal electrode 31 is electrically connected typically to a pad electrode 420 at the end of a branch 211A provided on the data line 211. On the other hand, the terminal electrode 32 is electrically connected typically to a pad electrode 420 at the end of a branch 212A provided on the scan line 212.

Each of the pad electrodes 420 is typically created on an outermost layer. As shown in FIGS. 19, 20A and 20B for example, each of the pad electrodes 420 is provided on a member on which the light emitting apparatus 1 is to be mounted. In this case, each of the pad electrodes 420 is made from typically a conductive material such as Au (gold).

In addition, the mounting substrate 210-1 is also provided with a plurality of support pillars shown in none of the figures. The support pillars set the gap between the mounting substrate 210-1 and the transparent substrate 210-2. The support pillars can be provided in an area facing the display area 210A or an area facing the frame area 210B.

Transparent Substrate 210-2

The transparent substrate 210-2 is typically a glass substrate, a resin substrate or the like. In the transparent substrate 210-2, the surface on the side of the light emitting apparatus 1 can be flat. It is desirable, however, to provide a rough surface. The rough surface can be provided over the entire area exposed to the display area 210A or provided only in an area facing the display pixel 213. The rough surface is provided with fine unevenness of such a degree that, when light emanating from the light emitting device 10 hits the rough surface, the rough surface scatters the light incident thereto. The unevenness of the rough surface can be created by carrying out typically a sand glass process or a dry etching process.

Driving Circuit

The driving circuit is a circuit for driving a plurality of display pixels 213 on the basis of a video signal. The driving circuit is composed to include typically a data driver for driving data lines 211 each connected to a display pixel 213 and a scan driver for driving scan lines 212 also each connected to a display pixel 213. The driving circuit is typically mounted on the mounting substrate 210-1 or provided separately from the display panel 210. In addition, the driving circuit can be connected to the mounting substrate 210-1 by lines shown in none of the figures.

Method for Manufacturing the Display Panel 210

Next, a typical method for manufacturing the display panel 210 is explained as follows.

First of all, a circuit substrate is typically prepared on a base material. The circuit substrate has an insulation layer, a line pattern and blacks shown in none of the figures. The insulation layer includes a plurality of data lines 211 embedded therein. The line pattern is composed of scan lines 212 and electrode pads 420.

Then, a plurality of light emitting apparatus 1 are mounted on the circuit substrate. The light emitting apparatus 1 are mounted on the circuit substrate by adoption of the same method as that already explained earlier in the description of the first embodiment. In this way, the mounting substrate 210-1 is created.

Subsequently, the mounting substrate 210-1 and the transparent substrate 210-2 are exposed to each other and, then, pasted on each other. In this way, the display panel 210 is manufactured.

Operations/Effects of the Display Apparatus 2

In this second embodiment, light emitting apparatus 1 are driven by the driving circuit through data lines 211 and scan lines 212 in an operation referred to as a simple matrix driving operation because the data lines 211 and the scan lines 212 are laid out to form a simple matrix. The driving circuit drives the light emitting apparatus 1 in order to sequentially supply currents to the light emitting apparatus 1 each provided in the vicinity of the intersection of one of the data lines 211 and one of the scan lines 212. In this way, an image is displayed on the display area 210A.

By the way, in this second embodiment, each light emitting apparatus 1 is mounted on a display pixel 213 provided on the display panel 210. Thus, the thickness of the light emitting apparatus 1 can be reduced. As a result, the thickness of the display panel 210 can also be reduced as well. In addition, since the light fetching efficiency of the light emitting apparatus 1 is high, a bright image can be obtained at a low power consumption.

On top of that, if the surface of the transparent substrate 210-2 in the second embodiment is a rough surface, some of light emanating from the light emitting apparatus 1 in an inclined direction is scattered by the rough surface. Thus, some of the scattered light passes through the transparent substrate 210-2 and is radiated to the outside. As a result, the light emanating from the light emitting apparatus 1 in an inclined direction is reflected by the rear surface of the transparent substrate 210-2 or confined in the transparent substrate 210-2 so that it is possible to reduce the amount of generated stray light. Accordingly, it is possible to prevent the light fetching efficiency from decreasing due to the transparent substrate 210-2.

In addition, if blacks are provided on the rear surface of the mounting substrate 210-1 in this second embodiment, it is not necessary to provide blacks on the transparent substrate 210-2. Thus, alignment is not required when pasting the mounting substrate 210-1 and the transparent substrate 210-2 on each other in a manufacturing process. As a result, the productivity is improved.

4: Modified Versions of the Second Embodiment

Figure 21:
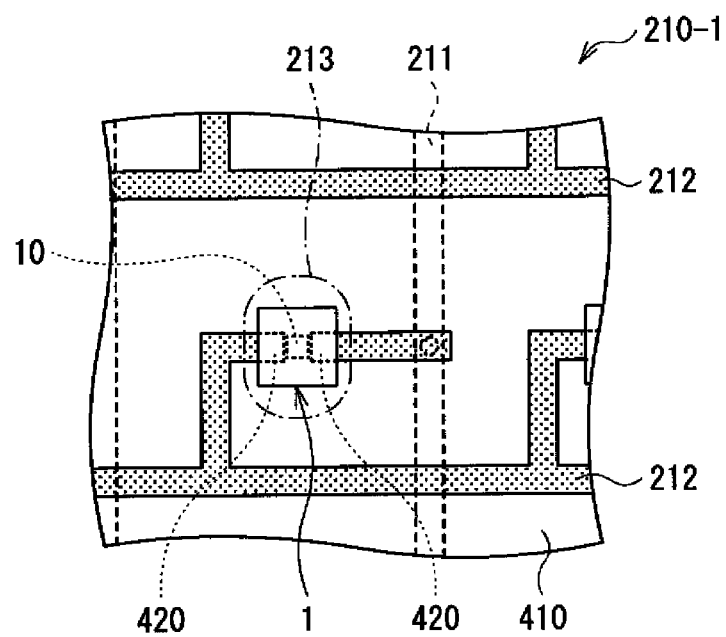
FIG. 21 is a top-view diagram showing a modified version of the layout on the surface of the mounting substrate used in the display apparatus shown in FIG. 18.

In the case of the second embodiment, every light emitting apparatus 1 includes three light emitting devices 10. However, every light emitting apparatus 1 may also include fewer than three light emitting devices 10, or four or more light emitting devices 10. As shown in FIG. 21 for example, every light emitting apparatus 1 may include only one light emitting device 10.

Figure 22:
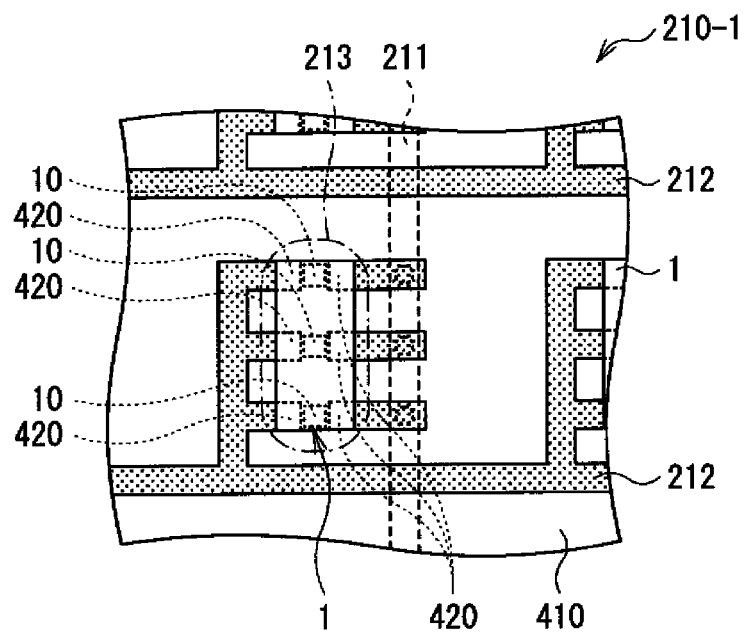
FIG. 22 is a top-view diagram showing another modified version of the layout on the surface of the mounting substrate used in the display apparatus shown in FIG. 18.

In addition, in the case of the second embodiment, a light emitting device 10 included in a light emitting apparatus 1 is connected to a data line 211 different from data lines 211 connected to other light emitting devices 10 included in the same light emitting apparatus 1. However, as shown in FIG. 22 for example, light emitting devices 10 included in the same light emitting apparatus 1 may also be connected to the same data line 211. In such a configuration, all light emitting devices 10 included in the same light emitting apparatus 1 are implemented by LEDs of the same type so that the display pixel 213 of the light emitting apparatus 1 emits light of the same color.

Figure 23:
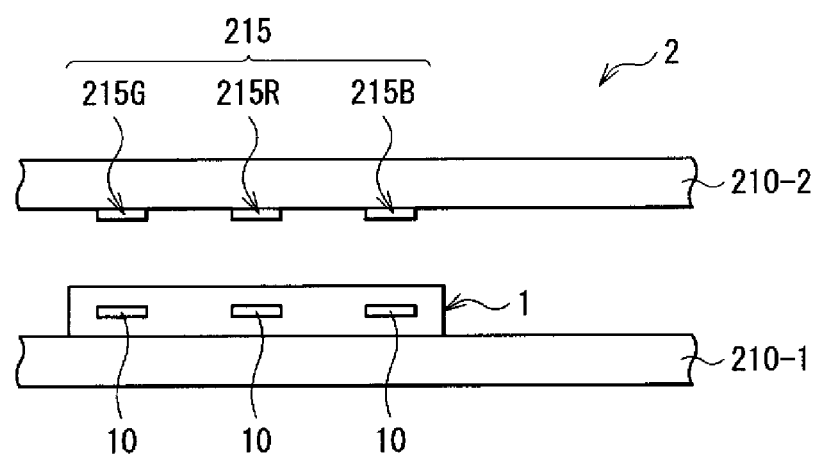
FIG. 23 is a cross-sectional diagram showing a modified version of the configuration of the display apparatus shown in FIG. 18.

On top of that, in the case of the second embodiment, the three light emitting devices 10 included in the same light emitting apparatus 1 emit light rays having wavelength bands different from each other. However, the three light emitting devices 10 included in the same light emitting apparatus 1 may also emit light rays having the same wavelength band. In this case, nevertheless, it is desirable to provide fluorescent substances 215 on the rear surface of the transparent substrate 210-2 as shown for example in FIG. 23. The provided fluorescent substances 215 are typically three fluorescent substances 215G, 215R and 215B provided for one light emitting apparatus 1 as shown in FIG. 23. The fluorescent substance 215G is a fluorescent substance for light having a green color, the fluorescent substance 215R is a fluorescent substance for light having a red color whereas the fluorescent substance 215B is a fluorescent substance for light having a blue color. In this case, if the light emitting device 10 is a LED chip emitting light having a blue color for example, the light emitted by the light emitting device 10 hits the fluorescent substances 215G, 215R and 215B and excites the fluorescent substances 215G, 215R and 215B so that the fluorescent substances 215G, 215R and 215B emit color light rays having luminance values each according to the amount of the incident color light ray.

5: Third Embodiment

Configuration

Figure 24:
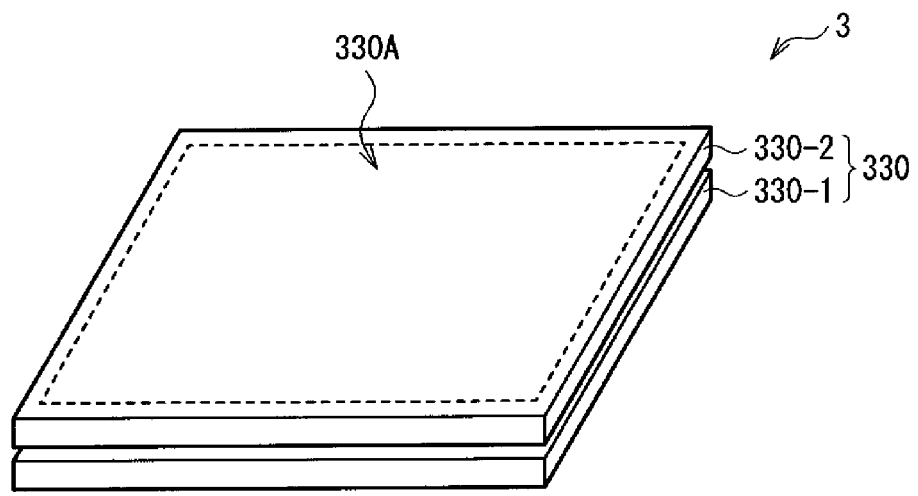
FIG. 24 is a perspective-view diagram showing a typical configuration of an illumination apparatus according to a third embodiment of the present disclosure.

Next, an illumination apparatus 3 according to a third embodiment of the present disclosure is explained as follows. The illumination apparatus 3 employs light emitting apparatus 1 each serving as a light source. The light emitting apparatus 1 employed in the illumination apparatus 3 is the light emitting apparatus according to the first embodiment described earlier or the modified versions of the first embodiment. FIG. 24 is a perspective-view diagram showing a typical rough configuration of the illumination apparatus 3 according to the third embodiment of the present disclosure. The illumination apparatus 3 is one of the so-called LED illumination apparatus in which LEDs are each employed to serve as a light source. As shown in FIG. 24 for example, the illumination apparatus 3 is provided with typically an illumination panel 330 and a driving circuit for driving the illumination panel 330. The driving circuit itself is not shown in FIG. 24 though.

Illumination Panel 330

The illumination panel 330 has a mounting substrate 330-1 and a transparent substrate 330-2 which are superposed on each other. The surface of the transparent substrate 330-2 is used as a surface for outputting illumination light. The transparent substrate 330-2 has a display area 330A at the center portion thereof.

Figure 25:
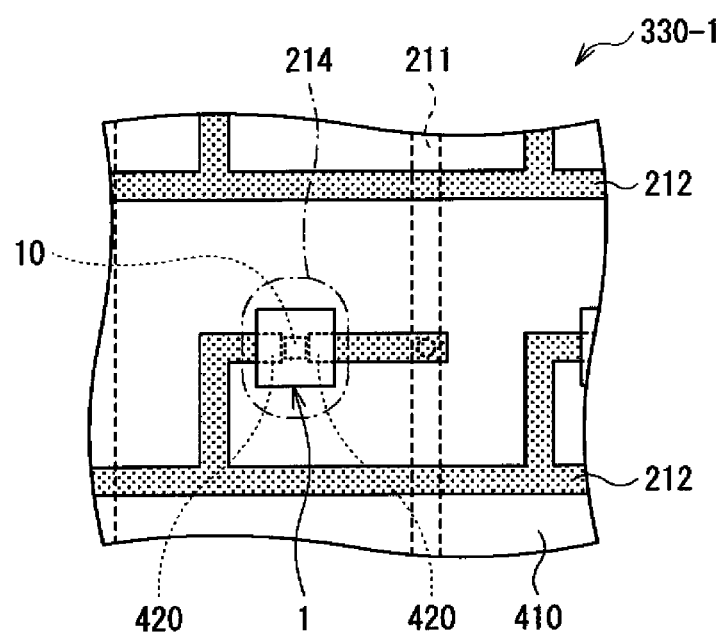
FIG. 25 is a top-view diagram showing a typical layout on the surface of a mounting substrate used in the illumination apparatus shown in FIG. 24.

FIG. 25 is a top-view diagram showing a typical layout of an area on a surface of the mounting substrate 330-1. This surface of the mounting substrate 330-1 is a surface exposed to the transparent substrate 330-2. This area is an area corresponding to the display area 330A. An illumination pixel 214 in this third embodiment corresponds to the display pixel 213 on the mounting substrate 210-1 in the second embodiment shown in FIG. 19.

(Driving Circuit)

The driving circuit is a circuit for driving a plurality of illumination pixels 214. The driving circuit is composed to include typically a data driver for driving data lines 211 each connected to an illumination pixel 214 and a scan driver for driving scan lines 212 also each connected to an illumination pixel 214. The driving circuit is typically mounted on the mounting substrate 330-1 or provided separately from the illumination panel 330.

Method for Manufacturing the Illumination Panel 330

Next, a typical method for manufacturing the illumination panel 330 is explained as follows.

First of all, a circuit substrate is typically prepared on a base material. The circuit substrate has an insulation layer, a line pattern and blocks shown in none of the figures. The insulation layer includes a plurality of data lines 211 embedded therein. The line pattern is composed of scan lines 212 and pad electrodes 215.

Then, a plurality of light emitting apparatus 1 are mounted on the circuit substrate. The light emitting apparatus 1 are mounted on the circuit substrate by adoption of the same method as that already explained earlier in the description of the first embodiment. In this way, the mounting substrate 330-1 is created.

Subsequently, the mounting substrate 330-1 and the transparent substrate 330-2 are exposed to each other and, then, pasted on each other. In this way, the illumination panel 330 is manufactured.

Operations/Effects of the Illumination Apparatus 3

In this third embodiment, light emitting apparatus 1 are driven by the driving circuit through data lines 211 and scan lines 212. The data lines 211 and the scan lines 212 are laid out to form a simple matrix. The driving circuit drives the light emitting apparatus 1 in order to sequentially supply currents to the light emitting apparatus 1 each provided in the vicinity of the intersection of one of the data lines 211 and one of the scan lines 212. In this way, illumination light is output from the display area 330A.

By the way, in this third embodiment, each light emitting apparatus 1 is mounted on an illumination pixel 214 on the illumination panel 330. Thus, the thickness of the light emitting apparatus 1 can be reduced. As a result, the thickness of the illumination panel 330 can also be reduced as well. In addition, since the light fetching efficiency of the light emitting apparatus 1 is high, bright illumination light can be obtained at a low power consumption.

The present disclosure has been exemplified above by explaining embodiments and modified versions of the embodiments. However, implementations of the present disclosure are by no means limited to the embodiments and the modified versions. That is to say, a variety of changes can be further made to the embodiments and the modified versions in order to implement the present disclosure.

For example, in the embodiments described above for example, every light emitting apparatus 1 includes a plurality of light emitting devices 10. However, every light emitting apparatus 1 may also include only one light emitting device 10. In addition, in accordance with the embodiments for example, on the mounting substrate 210-1 or 310-1, a plurality of light emitting apparatus 1 are laid out to form a matrix. However, the light emitting apparatus 1 may also be laid out to form a line. On top of that, lines for driving the light emitting apparatus 1 laid out on the mounting substrate 210-1 or 310-1 are the data lines 211 and scan lines 212 forming a simple matrix in conjunction with the data lines 211. However, the data lines 211 and scan lines 212 may also form another line pattern.

In addition, in accordance with the embodiments for example, an insulator 20 is provided. However, the insulator 20 can also be eliminated. In this case, each of the lines 33 and 34 becomes a midair line as the term indicates.

The present disclosure contains subject matter related to that disclosed in Japanese Priority Patent Application JP 2011-038639 filed in the Japan Patent Office on Feb. 24, 2011, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. A light emitting apparatus comprising:
   a light emitting chip having a bottom surface and a top surface, and including a first conductive type layer, an active layer and a second conductive type layer stacked in this order from the bottom surface,
   a first metal electrode disposed on the top surface of the light emitting chip,
   a junction material disposed below the bottom surface of the light emitting chip,
   an insulating member including a first insulating section and a second insulating section,
   a first metal layer disposed below the first insulating section so as to be exposed in a bottom surface of the light emitting apparatus, the first metal layer including a first terminal electrode and a second terminal electrode,
   a second metal layer disposed on the first insulating section and including (i) a first metal line electrically connected to the first conductive type layer via the junction material, and (ii) a second metal line electrically connected to the second conductive type layer via the first metal electrode,
   wherein the second insulating section covers at least a part of each of the first metal line and the second metal line,
   the first metal line and the second metal line are made of a same material, and disposed on the first insulating section so as to form a gap between the first metal line and the second metal line when viewed in a cross-sectional view, and
   the light emitting chip is configured to emit light from the top surface of the light emitting chip.

2. The light emitting apparatus according to claim 1, wherein each of the first terminal electrode and the second terminal electrode is an input/output terminal of the light emitting apparatus.

3. The light emitting apparatus according to claim 2, wherein the first terminal electrode is electrically connected to the first metal line, and the second terminal electrode is electrically connected to the second metal line.

4. The light emitting apparatus according to claim 3, wherein the first terminal electrode is in contact with the first metal line at a first connection point, and the second terminal electrode is in contact with the second metal line at a second connection point.

5. The light emitting apparatus according to claim 1, wherein the first insulating section and the second insulating section are integrally formed with a same insulating material.

6. The light emitting apparatus according to claim 1, wherein the light emitting chip is embedded in the first insulating section.

7. The light emitting apparatus according to claim 1, wherein the predetermined gap is filled with the insulating member.

8. The light emitting apparatus according to claim 1, further comprising a second metal electrode disposed below the bottom surface of the light emitting chip.

9. The light emitting apparatus according to claim 8, wherein the second metal electrode is disposed between the junction material and the bottom surface of the light emitting chip.

10. The light emitting apparatus according to claim 1, wherein the second metal line is in direct contact with the first metal electrode such that the second metal line is electrically connected to the light emitting chip without a bonding wire.

11. The light emitting apparatus according to claim 1, wherein the first metal line and the second metal line are made by a same process.

12. The light emitting apparatus according to claim 1, wherein, in a planer view of the light emitting apparatus, at least a part of the first metal line is located in a first side of the light emitting chip, and at least a part of the second metal line is located in a second side of the light emitting chip, the second side being opposite to the first side.

13. The light emitting apparatus according to claim 12, wherein, in a planer view of the light emitting apparatus, the second metal line overlaps with the light emitting chip.

14. The light emitting apparatus according to claim 1, wherein a side surface of the junction material is in contact with the insulating member.

15. The light emitting apparatus according to claim 8, wherein a side surface of the second electrode is in contact with the insulating member.

16. The light emitting apparatus according to claim 15, wherein a side surface of the junction material is in contact with the insulating member.

17. The light emitting apparatus according to claim 1, wherein a side surface of each of the first metal line and the second metal line is covered with the second insulating section.

18. A light emitting apparatus comprising:
a light emitting chip having a bottom surface and a top surface, and including a first conductive type layer, an active layer and a second conductive type layer stacked in this order from the bottom surface,
a first metal electrode disposed on the top surface of the light emitting chip,
a junction material disposed below the bottom surface of the light emitting chip,
an insulating member including a first insulating section and a second insulating section,
a first metal layer disposed below the first insulating section,
a second metal layer disposed on the first insulating section and including (i) a first metal line electrically connected to the first conductive type layer via the junction material, and (ii) a second metal line electrically connected to the second conductive type layer via the first metal electrode,
wherein the second insulating section is disposed on the first metal line and the second metal line,
the first metal line and the second metal line are made of a same material, and disposed on the first insulating section so as to form a gap between the first metal line and the second metal line, and
the light emitting chip is configured to emit light from the top surface of the light emitting chip.

19. The light emitting apparatus according to claim 18, wherein the first metal layer is configured to receive a driving signal for the light emitting chip.

20. The light emitting apparatus according to claim 19, wherein the first metal layer is electrically connected to a driving circuit that provides the driving signal for the light emitting chip.

21. The light emitting apparatus according to claim 18, wherein the predetermined gap is filled with the insulating member.

22. The light emitting apparatus according to claim 18, further comprising a second metal electrode disposed below the bottom surface of the light emitting chip.

23. The light emitting apparatus according to claim 18, wherein the first metal line and the second metal line are made by a same process.

24. The light emitting apparatus according to claim 19, wherein, in a planer view of the light emitting apparatus, at least a part of the first metal line is located in a first side of the light emitting chip, and at least a part of the second metal line is located in a second side of the light emitting chip, the second side being opposite to the first side.

25. The light emitting apparatus according to claim 18, wherein a side surface of the junction material is in contact with the insulating member.

26. The light emitting apparatus according to claim 22, wherein a side surface of the second electrode is in contact with the insulating member.

27. The light emitting apparatus according to claim 26, wherein a side surface of the junction material is in contact with the insulating member.

28. The light emitting apparatus according to claim 18, wherein a side surface of each of the first metal line and the second metal line is covered with the second insulating section.

29. The light emitting apparatus according to claim 1, wherein the light emitting apparatus is integrated into a package.

30. The light emitting apparatus according to claim 18, wherein the light emitting apparatus is integrated into a package.

* * * * *